(12) United States Patent
Lai et al.

(10) Patent No.: US 9,117,552 B2
(45) Date of Patent: Aug. 25, 2015

(54) SYSTEMS AND METHODS FOR TESTING MEMORY

(71) Applicant: KINGTIGER TECHNOLOGY (CANADA) INC., Markham (CA)

(72) Inventors: Bosco Chun Sang Lai, Markham (CA); Sunny Lai-Ming Chang, Markham (CA); Eric Sin Kwok Chiu, Mississauga (CA); Xiaoyi Cao, Shenzhen (CN); Shaodong Zhou, Shenzhen (CN); Lei Zhang, Shenzhen (CN)

(73) Assignee: KINGTIGER TECHNOLOGY(CANADA), INC., Markham (CA)

( * ) Notice: Subject to any disclaimer, the term of this patent is extended or adjusted under 35 U.S.C. 154(b) by 190 days.

(21) Appl. No.: 14/011,508

(22) Filed: Aug. 27, 2013

(65) Prior Publication Data
US 2014/0068360 A1     Mar. 6, 2014

Related U.S. Application Data

(60) Provisional application No. 61/694,188, filed on Aug. 28, 2012.

(51) Int. Cl.
*G11C 29/00* (2006.01)
*G11C 29/10* (2006.01)
*G11C 29/08* (2006.01)
*G11C 29/04* (2006.01)

(52) U.S. Cl.
CPC ............... *G11C 29/10* (2013.01); *G11C 29/08* (2013.01); *G11C 2029/0401* (2013.01); *G11C 2029/0409* (2013.01)

(58) Field of Classification Search
CPC ............... G11C 2029/0401; G11C 2029/0409; G11C 29/08; G11C 29/10
USPC ............... 726/25; 714/718, 733, 721, 30
See application file for complete search history.

(56) References Cited

U.S. PATENT DOCUMENTS

| | | | |
|---|---|---|---|
| 4,001,818 A | 1/1977 | Radichel et al. | |
| 4,209,846 A | 6/1980 | Seppa | |
| 4,240,143 A | 12/1980 | Besemer et al. | |
| 4,379,259 A | 4/1983 | Varadi et al. | |
| 4,426,688 A | 1/1984 | Moxley | |
| 4,479,214 A | 10/1984 | Ryan | |

(Continued)

FOREIGN PATENT DOCUMENTS

| | | |
|---|---|---|
| EP | 0704854 | 4/1996 |
| JP | 2005234744 | 9/2005 |

(Continued)

OTHER PUBLICATIONS

Hermann, AI., Diagnostic Data Comparator, IBM Technical Disclosure Bulletin, IBM Corp. New York, vol. 24, No. 5, Oct. 1981, pp. 2591-2592.

(Continued)

*Primary Examiner* — David Ton
(74) *Attorney, Agent, or Firm* — Barclay Damon LLP

(57) ABSTRACT

Embodiments of systems and methods for testing memory are disclosed, where memory errors are detected, and, in at least one embodiment, memory units containing errors are prevented from being accessed by applications on a computing system.

42 Claims, 9 Drawing Sheets

(56) References Cited

U.S. PATENT DOCUMENTS

| | | |
|---|---|---|
| 4,484,329 A | 11/1984 | Slamka et al. |
| 4,821,238 A | 4/1989 | Tatematsu |
| 4,965,799 A | 10/1990 | Green et al. |
| 5,224,107 A | 6/1993 | Mattes |
| 5,375,228 A | 12/1994 | Leary et al. |
| 5,450,576 A | 9/1995 | Kennedy |
| 5,539,697 A | 7/1996 | Kim et al. |
| 5,588,112 A | 12/1996 | Dearth et al. |
| 5,612,965 A | 3/1997 | Michaelson |
| 5,619,430 A | 4/1997 | Nolan et al. |
| 5,619,926 A | 4/1997 | Engelmann et al. |
| 5,666,482 A | 9/1997 | McClure |
| 5,671,229 A | 9/1997 | Harari et al. |
| 5,720,031 A | 2/1998 | Lindsay |
| 5,751,641 A | 5/1998 | Petrosino |
| 5,758,056 A | 5/1998 | Barr |
| 5,764,878 A | 6/1998 | Kablanian et al. |
| 5,774,647 A | 6/1998 | Raynham et al. |
| 5,794,175 A | 8/1998 | Conner |
| 5,844,913 A | 12/1998 | Hassoun et al. |
| 5,862,314 A | 1/1999 | Jeddeloh |
| 5,867,702 A | 2/1999 | Lee |
| 5,905,858 A | 5/1999 | Jeddeloh |
| 5,937,367 A | 8/1999 | Eckardt |
| 5,940,875 A | 8/1999 | Inagaki et al. |
| 5,959,914 A | 9/1999 | Gates et al. |
| 5,986,950 A | 11/1999 | Joseph |
| 5,995,424 A | 11/1999 | Lawrence et al. |
| 5,995,915 A | 11/1999 | Reed et al. |
| 5,996,096 A | 11/1999 | Dell et al. |
| 6,002,623 A | 12/1999 | Stave et al. |
| 6,014,759 A | 1/2000 | Manning |
| 6,018,484 A | 1/2000 | Brady |
| 6,029,262 A | 2/2000 | Medd et al. |
| 6,035,432 A | 3/2000 | Jeddeloh |
| 6,052,798 A | 4/2000 | Jeddeloh |
| 6,055,653 A | 4/2000 | LeBlanc et al. |
| 6,055,661 A | 4/2000 | Luk |
| 6,058,055 A | 5/2000 | Brunelle |
| 6,085,334 A | 7/2000 | Giles et al. |
| 6,125,392 A | 9/2000 | Labatte et al. |
| 6,134,690 A | 10/2000 | Ivaturi et al. |
| 6,154,851 A | 11/2000 | Sher et al. |
| 6,158,025 A | 12/2000 | Brisse et al. |
| 6,173,382 B1 | 1/2001 | Dell et al. |
| 6,178,526 B1 | 1/2001 | Nguyen et al. |
| 6,237,110 B1 | 5/2001 | Lin et al. |
| 6,260,127 B1 | 7/2001 | Olarig et al. |
| 6,272,588 B1 * | 8/2001 | Johnston et al. .............. 711/106 |
| 6,275,962 B1 | 8/2001 | Fuller et al. |
| 6,285,607 B1 | 9/2001 | Sinclair |
| 6,304,989 B1 | 10/2001 | Kraus et al. |
| 6,313,657 B1 | 11/2001 | Hashimoto |
| 6,324,657 B1 | 11/2001 | Fister et al. |
| 6,324,665 B1 | 11/2001 | Fay |
| 6,327,556 B1 | 12/2001 | Geiger et al. |
| 6,345,372 B1 | 2/2002 | Dieckmann et al. |
| 6,389,525 B1 | 5/2002 | Reichert et al. |
| 6,425,095 B1 | 7/2002 | Yasui |
| 6,430,720 B1 | 8/2002 | Frey et al. |
| 6,452,411 B1 | 9/2002 | Miller et al. |
| 6,460,152 B1 | 10/2002 | Demidov et al. |
| 6,499,117 B1 | 12/2002 | Tanaka |
| 6,499,120 B1 | 12/2002 | Sommer |
| 6,536,005 B1 | 3/2003 | Augarten |
| 6,546,511 B1 | 4/2003 | Sim et al. |
| 6,574,759 B1 | 6/2003 | Woo et al. |
| 6,600,614 B2 | 7/2003 | Lenny et al. |
| 6,601,183 B1 | 7/2003 | Larson et al. |
| 6,615,379 B1 | 9/2003 | Tripp et al. |
| 6,622,286 B1 | 9/2003 | Ngo et al. |
| 6,646,936 B2 | 11/2003 | Hamamatsu et al. |
| 6,701,474 B2 | 3/2004 | Cooke et al. |
| 6,708,298 B2 | 3/2004 | Corbin et al. |
| 6,728,907 B1 | 4/2004 | Wang et al. |
| 6,731,125 B2 | 5/2004 | Chang |
| 6,754,117 B2 | 6/2004 | Jeddeloh |
| 6,820,224 B1 | 11/2004 | Lin et al. |
| 6,851,076 B1 | 2/2005 | Cook, III et al. |
| 6,880,118 B2 | 4/2005 | Chen et al. |
| 6,888,366 B2 | 5/2005 | Kim et al. |
| 6,889,305 B2 | 5/2005 | Adelmann |
| 6,910,146 B2 | 6/2005 | Dow |
| 6,996,749 B1 | 2/2006 | Bains et al. |
| 7,010,452 B2 | 3/2006 | Gomes et al. |
| 7,065,630 B1 | 6/2006 | Ledebohm et al. |
| 7,085,980 B2 | 8/2006 | Martin-de-Nicolas et al. |
| 7,088,122 B2 | 8/2006 | Hartmann et al. |
| 7,092,902 B2 | 8/2006 | Eldridge et al. |
| 7,114,024 B2 | 9/2006 | Herbst |
| 7,119,567 B2 | 10/2006 | Ma et al. |
| 7,120,777 B2 | 10/2006 | Adelmann |
| 7,123,051 B1 | 10/2006 | Lee et al. |
| 7,131,046 B2 | 10/2006 | Volkerink et al. |
| 7,142,003 B2 | 11/2006 | Kanbayashi et al. |
| 7,155,370 B2 | 12/2006 | Nejedlo |
| 7,159,160 B2 | 1/2007 | Yoh et al. |
| 7,216,273 B2 | 5/2007 | Phelps et al. |
| 7,246,269 B1 | 7/2007 | Hamilton |
| 7,251,744 B1 | 7/2007 | Housty |
| 7,260,758 B1 | 8/2007 | Agrawal et al. |
| 7,269,765 B1 | 9/2007 | Charlton et al. |
| 7,272,758 B2 | 9/2007 | Roohparvar |
| 7,287,204 B2 | 10/2007 | Mayer et al. |
| 7,346,755 B2 | 3/2008 | Pomaranski et al. |
| 7,428,687 B2 | 9/2008 | Klein |
| 7,444,564 B2 | 10/2008 | Anand et al. |
| 7,447,955 B2 | 11/2008 | Niijima et al. |
| 7,478,285 B2 | 1/2009 | Fouquet-Lapar |
| 7,590,008 B1 | 9/2009 | Roge et al. |
| 7,603,595 B2 | 10/2009 | Sasaki |
| 7,694,195 B2 | 4/2010 | Khatri et al. |
| 7,783,919 B2 | 8/2010 | Khatri et al. |
| 7,848,899 B2 | 12/2010 | Lai et al. |
| 7,945,815 B2 | 5/2011 | Khatri et al. |
| 7,949,913 B2 * | 5/2011 | Norrod et al. .................. 714/723 |
| 8,276,029 B2 | 9/2012 | Khatri et al. |
| 8,321,731 B2 * | 11/2012 | Taylor et al. .................. 714/733 |
| 8,800,047 B2 * | 8/2014 | Kline et al. ..................... 726/25 |
| 2001/0042225 A1 | 11/2001 | Cepulis et al. |
| 2002/0073353 A1 | 6/2002 | Fish et al. |
| 2002/0108072 A1 | 8/2002 | Beng Sim et al. |
| 2002/0120826 A1 | 8/2002 | Venkatraman et al. |
| 2002/0157048 A1 | 10/2002 | Roohparvar |
| 2002/0184445 A1 | 12/2002 | Cherabuddi |
| 2003/0005367 A1 | 1/2003 | Lam |
| 2003/0058711 A1 | 3/2003 | Benedix et al. |
| 2003/0095455 A1 | 5/2003 | Dono et al. |
| 2003/0145250 A1 | 7/2003 | Chin |
| 2003/0208654 A1 | 11/2003 | Krontz et al. |
| 2003/0226090 A1 | 12/2003 | Thayer |
| 2004/0034825 A1 | 2/2004 | Jeddeloh |
| 2004/0042293 A1 | 3/2004 | Ogino |
| 2004/0088614 A1 | 5/2004 | Wu |
| 2004/0186688 A1 | 9/2004 | Nejedlo |
| 2005/0022066 A1 | 1/2005 | Herbst |
| 2005/0060514 A1 | 3/2005 | Pomaranski et al. |
| 2005/0120270 A1 | 6/2005 | Anand et al. |
| 2005/0149687 A1 | 7/2005 | Adelmann |
| 2006/0004942 A1 | 1/2006 | Hetherington et al. |
| 2006/0059383 A1 | 3/2006 | Roohparvar |
| 2006/0236165 A1 | 10/2006 | Cepulis et al. |
| 2007/0061637 A1 | 3/2007 | Ward et al. |
| 2007/0101238 A1 | 5/2007 | Resnick et al. |
| 2007/0136385 A1 | 6/2007 | Abrashkevich et al. |
| 2007/0136625 A1 | 6/2007 | Niijima et al. |
| 2007/0140025 A1 | 6/2007 | Chan et al. |
| 2007/0147144 A1 | 6/2007 | Tokiwa |
| 2007/0150777 A1 | 6/2007 | Sasaki |
| 2007/0174718 A1 | 7/2007 | Fouquet-Lapar |
| 2007/0217559 A1 | 9/2007 | Stott et al. |
| 2007/0260828 A1 | 11/2007 | Swaminathan et al. |
| 2008/0229143 A1 | 9/2008 | Muraki |
| 2008/0235505 A1 | 9/2008 | Hobson et al. |

(56) References Cited

U.S. PATENT DOCUMENTS

| | | |
|---|---|---|
| 2008/0247243 A1 | 10/2008 | Kang et al. |
| 2008/0301530 A1 | 12/2008 | Spanel |
| 2009/0049257 A1 | 2/2009 | Khatri et al. |
| 2009/0254777 A1 | 10/2009 | Feyt et al. |
| 2009/0300413 A1 | 12/2009 | Chang et al. |
| 2010/0251044 A1 | 9/2010 | Khatri et al. |
| 2011/0179324 A1* | 7/2011 | Lai et al. .............. 714/723 |
| 2011/0276844 A1* | 11/2011 | Potter et al. ........... 714/718 |
| 2011/0305086 A1 | 12/2011 | Fujimura et al. |
| 2012/0075944 A1 | 3/2012 | Ide et al. |
| 2012/0291132 A1* | 11/2012 | Kline et al. .............. 726/25 |
| 2013/0135951 A1 | 5/2013 | Ho et al. |

FOREIGN PATENT DOCUMENTS

| | | |
|---|---|---|
| WO | 98/02816 | 1/1998 |
| WO | 99/05599 | 2/1999 |
| WO | 99/50748 | 10/1999 |
| WO | 0229824 | 4/2002 |

OTHER PUBLICATIONS

Co-pending U.S. Appl. No. 14/011,508, "Systems and Methods for Testing Memory", filed Aug. 27, 2013.

Non-Final Office Action mailed Jun. 21, 2013 in U.S. Appl. No. 13/306,617 (US Pub. No. US-2013-0135951-A1, published May 20, 2013) Total 13 pgs.

* cited by examiner

SYSTEMS AND METHODS FOR TESTING MEMORY

PRIORITY CLAIM

This application claims the benefit and priority of U.S. Provisional Patent Application Ser. No. 61/694,188, filed on Aug. 28, 2012. The entire contents of such application are hereby incorporated by reference.

TECHNICAL FIELD

Embodiments described herein relate generally to computing systems, and memory modules and memory devices for use in computing systems.

BACKGROUND

A computing system typically employs storage media such as random access memory (RAM), for example. In contemporary computing systems, the amount of such memory utilized by the computing system may be on the order of gigabytes and terabytes.

As memory size increases, the probability of memory cells of memory devices either being manufactured defective or becoming defective during their deployment increases significantly. Correspondingly, the defective memory cells may cause the computing system to fail. This failure can potentially cause a "crash"—a termination in the current functioning of the computing system. This may result in the loss of critical information.

BRIEF DESCRIPTION OF THE DRAWINGS

For a better understanding of the example embodiments described herein and to show more clearly how they may be carried into effect, reference will now be made, by way of example only, to the accompanying drawings in which.

DETAILED DESCRIPTION

Figure 1A:
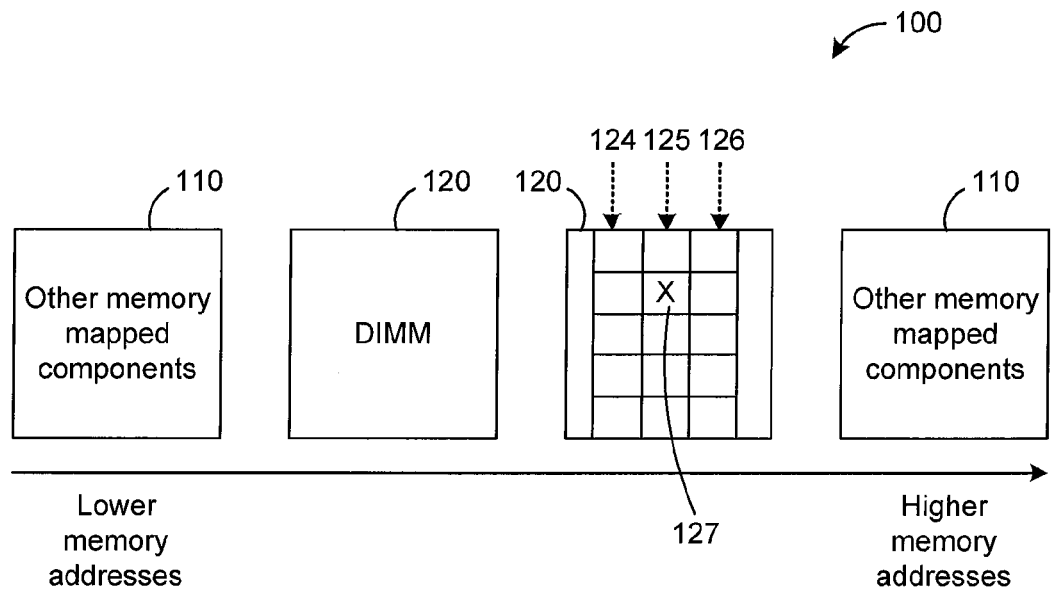
FIG. 1A is a block diagram that illustrates an example addressable memory space for a computing system.

Known memory protection techniques exist in which memory blocks containing errors are removed from an "available memory" list. This list can be utilized by the operating system of a computing system to prevent access by applications to memory blocks with errors, which could result in a serious memory failure and a crash of the computing system.

Many of the known memory protection techniques employ a rigid criterion when evaluating memory blocks. For example, a memory block may be considered only as either bad (and is thus removed from the available memory list) or good (and is thus permitted to remain in the available memory list). There was typically no attempt to distinguish between good cells in a memory block and, for example, potentially weaker cells (e.g. cells that may have failed a certain test, but where no pattern of regular reoccurrence of the error has been identified).

One weak cell in a memory block might be insufficient to render the memory block useless for all purposes; however, if the memory block can only be classified as good or bad, the memory block would typically be automatically considered as bad and removed from the available memory list simply because an error was identified during its testing, even when the error would not represent a material risk of a memory failure if the memory block was accessed.

At least one embodiment described herein utilizes multiple grades of quality for memory blocks (i.e. more than two quality grades, not merely "good" or "bad", for example). This may help to improve the utilization of available memory, introducing a practical compromise between the risk of potential memory failure and a desire to increase a pool of available memory.

Furthermore, in accordance with at least one embodiment described herein, there is provided a two-part method of testing memory cells. The first part entails performing a preliminary or "primary" test on a memory device for errors. The primary test is used to identify potentially defective memory cells. The second part entails performing a further, more comprehensive verification test (hereinafter referred to as a "focus" test) on the same memory device. The focus test is used to verify that a given memory cell or memory block that failed the primary test is, in fact, defective.

Memory blocks with memory cells that are identified as defective by the focus test may be subsequently removed from available memory on a computing system. However, memory blocks with, for example, transient or other non-reproducible errors (e.g. where an error with a given memory cell was identified in the primary test but could not be successfully verified in the focus test, this might suggest that the memory cell is merely "weak" but not defective) could still be made available for use.

In one broad aspect, there is provided a method of testing a memory device within a computing system, wherein a plurality of applications are executable by at least one processor of the computing system, the method comprising: performing a first memory test on the memory device; detecting, from the first memory test, at least one error in a memory unit of the memory device; in response to the detecting, performing acts to verify the at least one error comprising: preventing at least one of the plurality of applications from accessing the memory unit; performing a second memory test on the memory unit; determining, from the second memory test, whether the at least one error is successfully verified; and if the at least one error is successfully verified, identifying the memory unit as defective.

In one embodiment, the identifying comprises recording an identification of the memory unit in a persistent memory.

In one embodiment, the method further comprises: if the at least one error is successfully verified, recording, in association with the identification of the memory unit in the persistent memory, an indication of a number of errors detected in the memory unit.

In one embodiment, the memory unit comprises one of: a single memory cell of the memory device; or a memory block consisting of a plurality of memory cells of the memory device.

In one embodiment, performing the first memory test comprises applying a first number of test patterns, and performing the second memory test on the memory unit comprises applying a second number of test patterns, the second number being substantially greater than the first number.

In one embodiment, the method further comprises: performing the second memory test on one or more memory cells neighboring the memory unit; wherein the at least one error is successfully verified when a number of errors that are detected by the second memory test in the memory unit exceeds a threshold value associated with the second memory test.

In one embodiment, the method further comprises: restoring access by the at least one of the plurality of applications to the memory unit in response to determining that the at least one error is not successfully verified.

In one embodiment, the method further comprises: continuing to prevent the at least one of the plurality of applications from accessing the memory unit in response to determining that the at least one error is successfully verified.

In one embodiment, the method further comprises: generating an updated system memory map that excludes the memory unit if the memory unit is identified as defective.

In one embodiment, a threshold value is associated with the first memory test, and the acts to verify the at least one error are performed in response to determining that a number of errors that are detected by the first memory test in the memory unit exceeds the threshold value associated with the first memory test.

In one embodiment, the threshold value associated with the first memory test comprises one of: zero; or a value greater than zero.

In one embodiment, the threshold value associated with the first memory test is user-configurable.

In one embodiment, the acts to verify the at least one error further comprise: recording an identification of the memory unit in a memory pending completion of the second memory test.

In one embodiment, the method further comprises: determining a physical address associated with the memory unit, wherein the identification of the memory unit comprises the physical address.

In one embodiment, the method further comprises: recording, in association with the identification of the memory unit in the memory, an indication of a number of errors detected in the memory unit.

In one embodiment, the method further comprises: deleting the identification of the memory unit from the memory upon completion of the second memory test.

In one embodiment, the at least one error is successfully verified when a number of errors that are detected by the second memory test in the memory unit exceeds a threshold value associated with the second memory test.

In one embodiment, the method further comprises: restoring access by the at least one of the plurality of applications to the memory unit if the number of errors that are detected by the second memory test in the memory unit falls below a threshold value associated with the restoring.

In one embodiment, the threshold value associated with the second memory test comprises one of: zero; or a value greater than zero.

In one embodiment, the threshold value associated with the second memory test is user-configurable.

In one embodiment, the method is performed by a testing application, and the preventing comprises isolating the memory unit from access by any one of the plurality of applications, other than the testing application.

In one embodiment, the method is performed in response to determining that the computing system has spare resources due to an underutilization of the at least one processor.

In another broad aspect, there is provided a computing system configured to allow testing of a memory device within the computing system, the system comprising: at least one processor, wherein a plurality of applications are executable by the at least one processor; and a memory; wherein the plurality of applications comprises a testing application, comprising instructions that when executed by the at least one processor, configured the at least one processor to: perform a first memory test on the memory device; detect, from the first memory test, at least one error in a memory unit of the memory device; in response to detecting the at least one error, perform acts to verify the at least one error comprising: preventing at least one the plurality of applications from accessing the memory unit; performing a second memory test on the memory unit; determining, from the second memory test, whether the at least one error is successfully verified; and if the at least one error is successfully verified, identifying the memory unit as defective.

In another broad aspect, there is provided a computer-readable medium comprising instructions for testing a memory device within a computing system, wherein the instructions, when executed by at least one processor of the computing system, configure the at least one processor to: perform a first memory test on the memory device; detect, from the first memory test, at least one error in a memory unit of the memory device; in response to detecting the at least one error, perform acts to verify the at least one error comprising: preventing at least one the plurality of applications from accessing the memory unit; performing a second memory test on the memory unit; determining, from the second memory test, whether the at least one error is successfully verified; and if the at least one error is successfully verified, identifying the memory unit as defective.

In another broad aspect, there is provided a method of testing a memory device, the method comprising: performing a first memory test on the memory device, wherein the first memory test is performed under operating conditions that exceed specification requirements for the memory device; detecting, from the first memory test, at least one error in a memory unit of the memory device; in response to the detecting, performing acts to verify the at least one error comprising: performing a second memory test on the memory unit, wherein the second memory test is performed under operating conditions within the specification requirements for the memory device; determining, from the second memory test, whether the at least one error is successfully verified; and if the at least one error is successfully verified, identifying the memory unit as defective.

In one embodiment, the identifying comprises recording an identification of the memory unit in a persistent memory.

In one embodiment, the method further comprises: if the at least one error is successfully verified, recording, in association with the identification of the memory unit in the persistent memory, an indication of a number of errors detected in the memory unit.

In one embodiment, the memory unit comprises one of: a single memory cell of the memory device; or a memory block consisting of a plurality of memory cells of the memory device.

In one embodiment, performing the first memory test comprises applying a first number of test patterns, and performing the second memory test on the memory unit comprises applying a second number of test patterns, the second number being substantially greater than the first number.

In one embodiment, the method further comprises: performing the second memory test on one or more memory cells neighboring the memory unit; wherein the at least one error is successfully verified when a number of errors that are detected by the second memory test in the memory unit exceeds a threshold value associated with the second memory test.

In one embodiment, a threshold value is associated with the first memory test, and the acts to verify the at least one error are performed in response to determining that a number of errors that are detected by the first memory test in the memory unit exceeds the threshold value associated with the first memory test.

In one embodiment, the threshold value associated with the first memory test comprises one of: zero; or a value greater than zero.

In one embodiment, the threshold value associated with the first memory test is user-configurable.

In one embodiment, the acts to verify the at least one error further comprise: recording an identification of the memory unit in a memory pending completion of the second memory test.

In one embodiment, the method further comprises: recording, in association with the identification of the memory unit in the memory, an indication of a number of errors detected in the memory unit by the first memory test.

In one embodiment, the method further comprises: deleting the identification of the memory unit from the memory upon completion of the second memory test.

In one embodiment, the at least one error is successfully verified when a number of errors that are detected by the second memory test in the memory unit exceeds a threshold value associated with the second memory test.

In one embodiment, the threshold value associated with the second memory test comprises one of: zero; or a value greater than zero.

In one embodiment, the threshold value associated with the second memory test is user-configurable.

In one embodiment, the method is performed in a factory environment.

In another broad aspect, there is provided a testing system configured to test a memory device, the system comprising: at least one processor; and a memory; wherein the at least one processor is configured to: perform a first memory test on the memory device, wherein the first memory test is performed under operating conditions that exceed specification requirements for the memory device; detect, from the first memory test, at least one error in a memory unit of the memory device; in response to detecting the at least one error, perform acts to verify the at least one error comprising: performing a second memory test on the memory unit, wherein the second memory test is performed under operating conditions within the specification requirements for the memory device; determining, from the second memory test, whether the at least one error is successfully verified; and if the at least one error is successfully verified, identifying the memory unit as defective.

In another broad aspect, there is provided a computer-readable medium comprising instructions for testing a memory device, wherein the instructions, when executed by at least one processor of a testing system, configure the at least one processor to: perform a first memory test on the memory device, wherein the first memory test is performed under operating conditions that exceed specification requirements for the memory device; detect, from the first memory test, at least one error in a memory unit of the memory device; in response to detecting the at least one error, perform acts to verify the at least one error comprising: performing a second memory test on the memory unit, wherein the second memory test is performed under operating conditions within the specification requirements for the memory device; determining, from the second memory test, whether the at least one error is successfully verified; and if the at least one error is successfully verified, identifying the memory unit as defective.

Details on these embodiments and aspects, and other embodiments and aspects, are provided in the description herein.

Referring first to FIG. 1A, a block diagram that illustrates an example addressable memory space for a computing system is shown generally as 100.

Addressable memory space 100 comprises multiple memory components that are capable of being addressed as memory. Examples of memory components may include memory modules 120, shown as dual inline memory modules (DIMMs) in FIGS. 1A and 1B by way of example, and other memory mapped components 110. It will be understood by persons skilled in the art that memory modules other than DIMMs may be employed. A memory space may comprise multiple memory modules and/or other memory components, of a single type or of different types.

By way of illustration, memory space 100 may be subject to a memory scanning operation that scans the memory in each memory device to analyze all addressable memory locations in succession. In FIG. 1A, for instance, memory blocks associated with memory block addresses 124, 125 and 126 respectively (in this example, the memory block associated with memory block address 125 contains a defective memory location 127 associated with one or more cells) may be scanned in succession. A "memory block" typically refers to a contiguous memory address space consisting of a row, a half-row, or some other grouping of memory cells within an individual memory device.

In one known system, the memory scanning operation occurs during the powering up of a computing system. The computing system may then create a memory map, which excludes defective memory locations as determined from the memory scanning operation, or as determined from prior start-up scans. Data identifying defective memory locations within a particular memory space may be stored in a persistent store on a memory module. The persistent store may be a Serial Presence Detect (SPD) device on the memory module, for example.

Figure 1B:
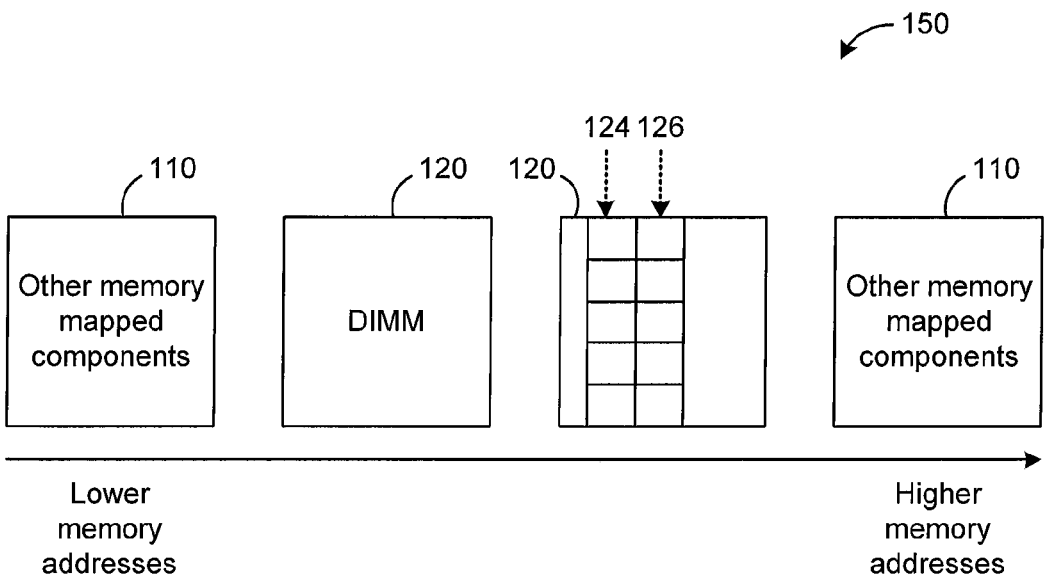
FIG. 1B is a block diagram that illustrates the usable memory space of the example addressable memory space of FIG. 1A.

Continuing the example of FIG. 1A, FIG. 1B depicts a usable memory space 150, in which the memory block associated with memory block address 125 (FIG. 1A) has been excluded from an updated memory map after the defective memory location 127 in that memory block was detected during a start-up scan.

Figure 1C:
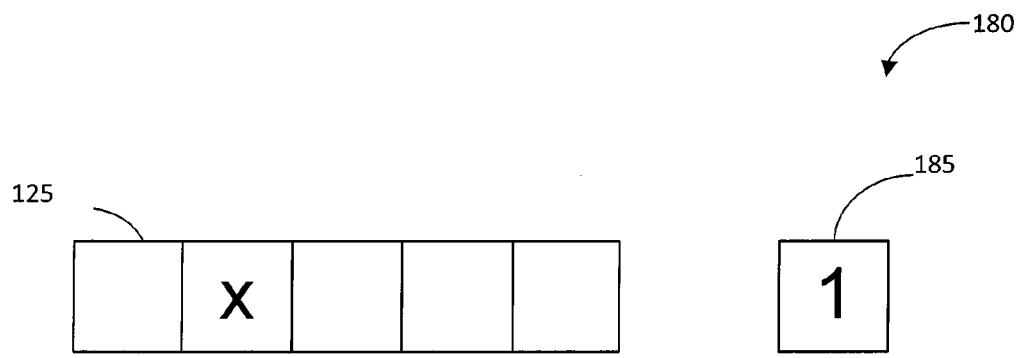
FIG. 1C illustrates a memory block with a corresponding one-bit flag.

FIG. 1C illustrates a memory block 180 associated with memory block address 125 and a corresponding one-bit flag 185. Such one-bit flags may have been used in known systems to convey information if the particular memory block is "bad"

or "good". If the memory block is good, as indicated by the one-bit flag (e.g. "0"), it would be allocated to the addressable memory space. On the other hand, if the memory block is bad, as indicated by the one-bit flag (e.g. "1"), it would be discarded and not allocated to the addressable memory space (see e.g. FIG. 1B).

In at least one embodiment, multi-bit flags may be used and associated with memory blocks to facilitate a grading of the memory blocks. The grade of a given memory block may represent a quality measure of the memory block. Accordingly, a multi-bit flag may provide a more useful and precise indicator of the quality of the memory block as compared to systems in which one-bit flags are employed.

Figure 1D:
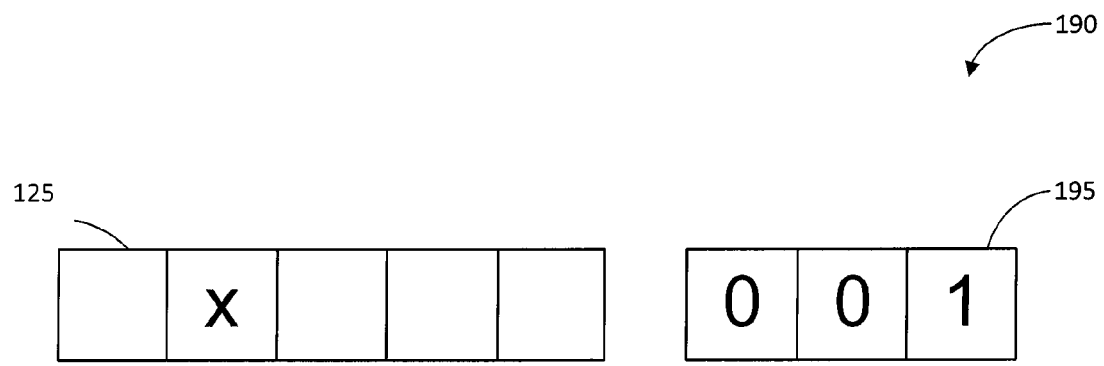
FIG. 1D illustrates a memory block with a corresponding three-bit flag.

For example, FIG. 1D illustrates a memory block 190 associated with memory block address 125 and a corresponding three-bit flag 195. Multi-bit flags such as three-bit flag 195 may be used to convey extra information about a memory block, beyond the simple notion of whether the memory block is good, or is bad and should be discarded. The three-bit flag 195 as depicted in this example, allows for any one of up to eight grades (e.g. with one of the assigned values 000, 001, 010, 011, 100, 101, 110, 111) to be associated with a memory block, with each grade representing a level of quality identified (e.g. through testing) for the memory block. In variant embodiments, more or less than eight grades may be employed.

In one embodiment, the grade to be associated with a given memory block may be dependent on the number of errors identified during a particular test of the memory block. For example, if only one memory cell of the memory block was found to contain an error, and the error can be attributed to a single instance of a failed match in respect of a single test pattern (with all other tests being successfully passed), the memory block may still be considered to be of very high quality and remain suitable for use. If the grade '000' represents an error-free memory block (with grade '111' representing a memory block of extremely poor quality), grade '001' may be used to identify a memory block of very high quality despite the fact that an error was identified during testing of that memory block.

Different criteria, including the number and/or the type of errors identified in one or more tests may be associated with each available grade. In particular, there can be flexibility in how values for the multi-bit flags are set depending on the particular implementation. However, in general, flags for blocks containing "hard failures" that would typically cause the computing system to crash, will generally be assigned the highest values.

In variant implementations, the rankings of flag values may be reversed (e.g. the blocks with hard failures may be assigned the lowest values, while error-free memory blocks may be assigned the highest values), or some other ranking methodology may be employed.

Figure 2:
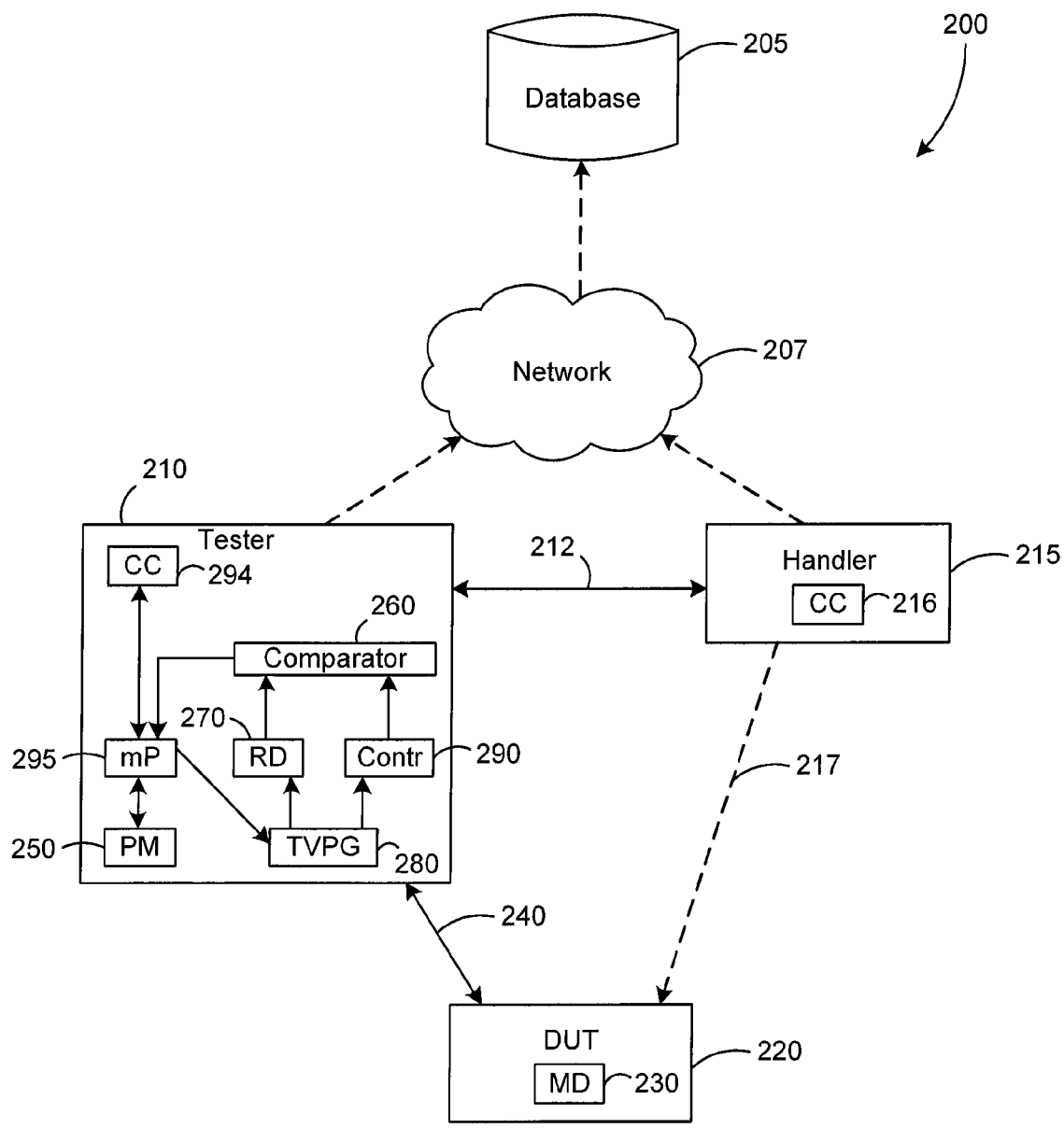
FIG. 2 is a block diagram of a testing system comprising a memory device under test and a tester module, in accordance with at least one embodiment.

Referring now to FIG. 2, a block diagram of a testing system comprising a memory device under test and a tester module in accordance with at least one embodiment is shown generally as 200.

Typically, memory devices are tested and certified by manufacturers to ensure that signal parameters are within an allowable range set by the manufacturer or by corresponding appropriate standards. Complete testing of a memory device may include both functional testing as well as application-specific testing.

Specific to memory devices, functional testing generally tests whether or not a memory device performs particular functions properly and meets the manufacturer's specifications. For example, functional testing may test whether or not a digital value written to a cell of memory will later be retrieved without error, regardless of how the memory device is implemented. More specifically, memory devices may be subject to pattern testing, which is a method of exercising each memory device to verify its functionality with regards to certain test vector patterns.

Functional testing may also test whether or not certain critical operating characteristics of a memory device fall within an allowable range of values. Parametric tests verify critical operating characteristics, including characteristics such as, for example, power consumption, standby current, leakage current, voltage levels and access time. The allowable range may be set by the manufacturer of the memory device or by the corresponding appropriate standards.

While functional testing is generally oriented towards discovering whether or not a memory device under test is likely to fail during its intended use or application, it typically involves testing memory devices to verify how they execute a specific set of functions that are specially designed for this purpose.

Further testing of a memory device may also involve application-specific testing. During application-specific testing, memory devices may be subject to a testing of their system behavior in order to detect their behavioral failures. Behavioral failure is a type of failure that occurs when a memory device is operated within an actual application system. For example, a behavioral failure may be a failure that occurs as a result of a specific command or access sequence to a memory device that is performed during the performance of regular operations on a personal computer (PC).

Functional testing will not necessarily detect behavioral failures. With functional testing, the operation of a memory device under test does not need to be indicative of how the device will behave during its intended application. Accordingly, complete and comprehensive testing of a memory device may require application-specific testing in addition to functional testing.

Referring again to FIG. 2, the test system 200 generally includes a tester 210, a handler 215 and a device under test (DUT) 220. The tester 210 may be connected to the handler 215 via an interface 212. The tester 210 and the handler 215 may also be connected to a database 205 via a network 207 or by other means known to persons skilled in the art.

The tester 210 may include, for example, a program memory (PM) 250, a comparator 260, a test vector pattern generator (TVPG) 280, a controller (Contr) 290, a control computer (CC) 294, and a microprocessor (mP) 295. In practice, the functions of some of the elements shown logically in FIG. 2 may be integrated into one or more physical components. Where the DUT 220 includes at least one memory device (MD) 230, the tester 210 may also include a reference memory device (RD) 270.

Only certain electrical connections between the various components of the tester 210 and of the test system 200 are illustrated, for ease of exposition. However, it will be understood by persons skilled in the art that the tester 210 and/or test system 200 may include components or connections in addition to or as an alternative to one or more of the components or connections shown in FIG. 2.

In the example of FIG. 2, the tester 210 transmits signals to and receives signals from the DUT 220 via a communication channel 240.

In FIG. 2, the DUT 220 is illustrated to be a single memory device 230. However, it will be understood that the DUT 220 may comprise a plurality of memory devices, and the plurality of memory devices may belong to one or more memory modules. The testing of each of the plurality of memory devices may be performed consecutively or in parallel, for example. In variant embodiments, the DUT 220 may include one or more devices other than memory devices.

In one example implementation, the tester 210 and the handler 215 co-operate with each other during testing of the DUT 220. Each of the tester 210 and the handler 215 may be equipped with a control computer or other processing element (e.g. 294 and 216, respectively) configured, at least, to communicate test results. For example, the handler 215 may first load (by a mechanical means 217, such as for example, a robotic device) the DUT 220 into a testing unit (not shown) of the tester 210 to facilitate testing. The tester 210 performs testing on the DUT 220. Test results are processed by control computer (CC) 294. The control computer 294 in the tester may then send the test results to a control computer 216 in the handler, for example, via the interface 212. Based on the received test results, the control computer 216 in the handler may then determine where to physically move the tested memory device from the testing unit.

Some example operations of the tester 210 in relation to the DUT 220 are described in the paragraphs below. For example, testing may be performed on each individual memory cell of the memory device 230 so that if a given individual memory cell is determined to be defective (e.g. the memory cell failed a test carried out by the test system 200), then its corresponding memory location may be identified.

To perform testing on the DUT 220, the microprocessor 295 may retrieve an instruction or instructions from the program memory 250. In response, the microprocessor 295 may instruct the TVPG 280 to generate a digital representation of a test vector pattern, which is then sent by the TVPG 280 to the controller 290. The test vector pattern may be utilized in the testing process to determine defective memory locations on the DUT 220, which, in this example, is the memory device 230. Alternatively, the DUT 220 may comprise a plurality of memory devices.

Upon receipt of the test vector pattern generated by the TVPG 280, the controller 290 converts the test vector pattern into an electrical waveform. The controller 290 then outputs the electrical waveform to the DUT 220 via the communication channel 240. The TVPG 280 also sends a digital representation of the test vector pattern to the reference memory device 270 for temporary storage, to be used at a later stage in the testing procedure. In variant implementations, a reference memory module comprising multiple memory devices may be employed instead of a reference memory device 270, particularly where the DUT 220 comprises multiple memory devices, for example.

The electrical waveform is transmitted electrically across the communication channel 240 to the DUT 220 and is sampled back into digital form. At some point after the electrical waveform has been transmitted to the DUT 220 by the controller 290, the DUT 220 electrically transmits, across the communication channel 240, a response data signal containing a response bit pattern for each memory device of the DUT 220, namely the memory device 230 illustrated in FIG. 2 in this example. An appropriate component or module thereon, which is not shown, may be configured to convert the response data signal from the DUT 220 from its digital form to an electrical waveform.

The controller 290 then converts the response data signals from the DUT 220 into digital form. The response data signals include the response data signals generated by the memory device 230 which are dependent on the test vector pattern sent by the controller 290 as an electrical waveform to the DUT 220.

The controller 290 then relays the converted response data signal from the DUT 220 to the comparator 260. At the comparator 260, the response data signal from the DUT 220 is compared with a digital form of a reference signal (i.e., a reference bit pattern, also generally referred to as an expected bit pattern), namely the signal that the controller 290 expects to receive from the DUT 220 that sent the response data signal. In one embodiment, the previously stored reference signal is transmitted to the comparator 260 by the reference memory device 270. The comparator 260 determines whether or not the response data signal is an identical match, based on a digital comparison, to the corresponding reference signal, and outputs that logical determination to the microprocessor 295.

If the comparator 260 determines a digital match between the two compared signals (i.e., between the response data signal and the corresponding reference signal), then the DUT 220 has, at least in the context of that particular test vector pattern, produced valid data. Where the DUT 220 is not determined to have undergone failure during testing and is determined to have met all required specifications, the DUT 220 may be considered a "good", "error-free" or "defect-free" memory device.

However, if the comparator 260 determines that the two compared signals are not digitally identical, then the DUT 220 may have undergone a failure of some kind. As previously described, testing is performed on each individual memory cell on the memory device 230. Therefore, after the comparator 260 determines that the DUT 220 has undergone a failure, the one or more memory locations on the memory device where the failure occurred may be identified and those one or more memory locations may be deemed to be "defective". Data that identifies the one or more defective memory locations on the memory device, once generated, may be stored.

For example, the data that identifies the one or more defective memory locations on the memory device may be stored in a database 205. This database 205 may reside on a computer system that may be external to, or within or coupled to the tester 210. If the database 205 is external to the tester 210, the database may be accessible via a network 207, for example.

Each entry associated with a defective memory location in the database 205 may comprise, for example, a memory device identification number, in addition to data identifying the actual memory location on the memory device. Optionally, other details describing a failure of the DUT 220 during testing (e.g. the technical characteristics of the DUT or the test pattern that caused the failure of the DUT) may also be recorded in the database 205. Further, information associated with the handler 215 may also be stored in the database 205, such as data identifying the handler used in the testing process (e.g. if multiple handlers are used) and data identifying the location in which the handler placed the memory device for testing (e.g. a test socket identifier). Also, information associated with the tester 210 may also be stored in the database 205, such as data identifying the tester used in the testing process (e.g. if multiple testers are used).

In accordance with at least one embodiment, the database 205 may be used to store, for a given memory device, data that identifies one or more defective memory locations on the memory device for subsequent recording onto a persistent store on a memory module. Other data obtained from the database 205, such as operating parameters for the memory devices (e.g. Joint Electron Devices Engineering Council (JEDEC) memory standards) and manufacturer-specific parameters or data, for example, may also be stored in the persistent store on the memory module.

The testing of memory devices can be performed within a factory testing environment with the help of a memory tester (e.g. tester 210). Furthermore, methods of testing of memory devices can also be performed "in the field"—after the memory device has been deployed and is in use in a computing system, for example—with the aid of testing software.

In accordance with at least one embodiment described herein, a two-part method may be employed to test memory cells. The first part entails performing a preliminary or "primary" test on a memory device to identify potentially defective memory cells. A defective memory cell is a memory cell that fails to operate according to memory specifications. The second part entails performing a verification or "focus" test on the same memory device to verify whether a given memory cell or memory block that failed the primary test is defective and to what degree. This technique may provide more accurate results as compared to conventional memory testing techniques where all memory cells are uniformly subject to the same routine tests.

Figure 3A:
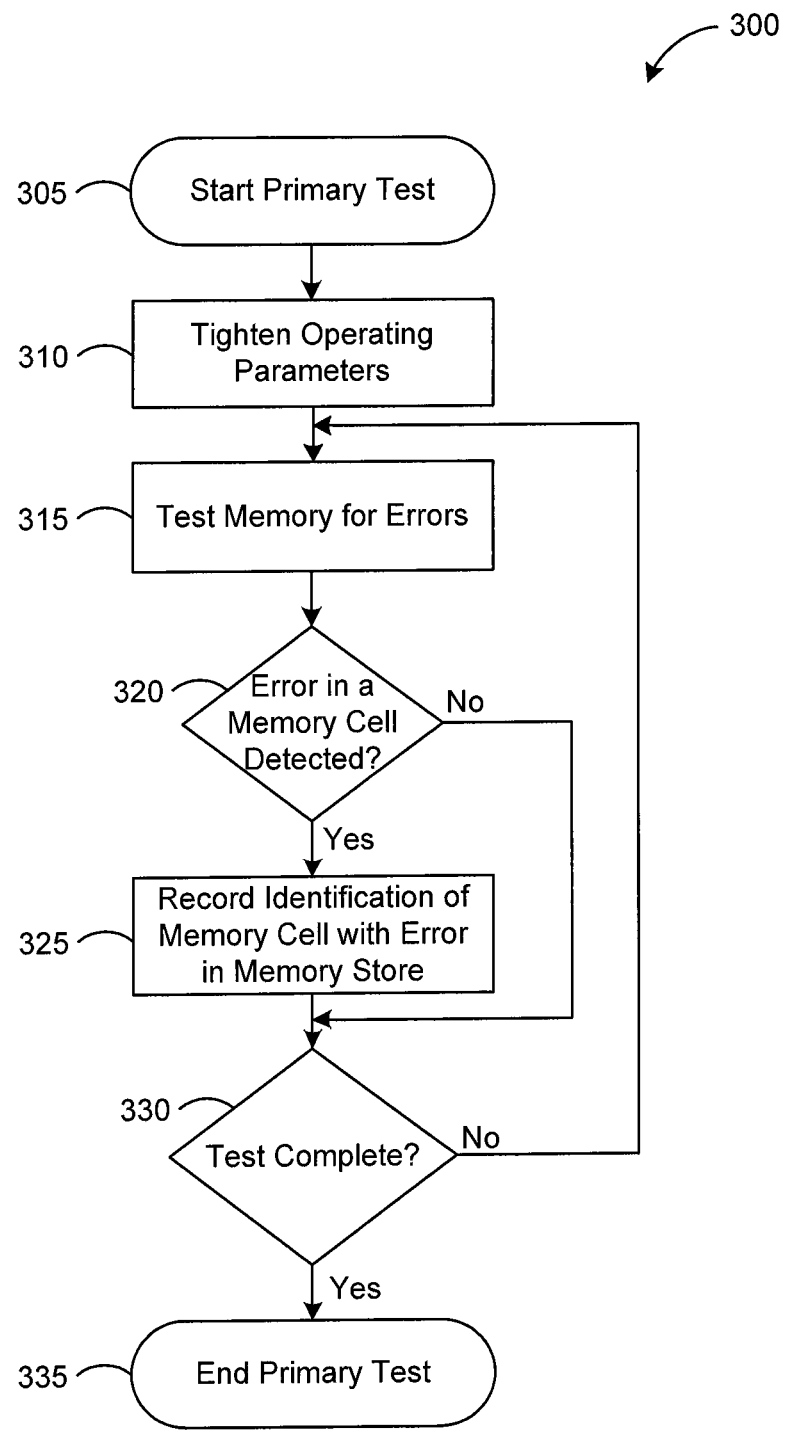
FIG. 3A is a flow diagram illustrating acts of a method of performing a primary test on a memory device in accordance with at least one embodiment.

Referring now to FIG. 3A, a flow diagram illustrating acts of a method of performing a primary test on a memory device in accordance with at least one embodiment is shown generally as 300.

In one example implementation, a testing system (e.g. tester 210 of FIG. 2) may comprise at least one processor (e.g. 295 of FIG. 2) and a memory (e.g. 250 of FIG. 2), wherein the at least one processor is configured to perform acts of method 300.

In at least one embodiment, a memory test under operating conditions that exceed specification requirements (e.g. as devised by either a memory manufacturer or JEDEC memory standards) for the memory device (e.g. memory device 230 of FIG. 2) is performed. For example, this memory test is performed under tightened operating parameters (e.g. voltage, timing or temperature) that exceed the specification requirements. Accordingly, method 300 may also be referred to as an "over-the-spec" stress test. The acts of method 300 may be performed in a factory testing environment. The acts of method 300 begin at 305.

At 310, the tightened operating parameters are initially set. At 315, the memory test on the memory device is performed (e.g. with the help of tester 210 and handler 215 of FIG. 2). As noted above, the memory test is performed under operating conditions that exceed specification requirements for the memory device. Although not explicitly shown in FIG. 3A, during the memory test 315, the tightened operating parameters 310 may be adjusted in an incremental manner to allow for testing within a range of operating parameters. Testing may involve the use of test vector patterns as generally described with reference to FIG. 2. In some embodiments, functional testing and application-specification testing may be performed at 315.

If at least one memory error is detected in a memory unit (a memory unit may be defined as either a memory cell or a plurality of memory cells as a memory block as noted below) of the memory device at 320, then at 325, in response to detection of the at least one memory error, an identification of the memory unit is recorded in a memory store. Otherwise, the flow of method 300 will proceed directly to 330.

More specifically, at 325, the identification of the memory unit is recorded in the memory store pending the completion of a further test (see e.g. FIG. 3B) that will be performed to verify the detected memory errors. The memory unit may be a single memory cell of the memory device, and the identification of the memory unit may comprise an identification of that memory cell (e.g. cell address), as shown by way of example in FIG. 3A. However, in some embodiments, the memory unit may comprise a memory block consisting of a plurality of memory cells in the memory device, and the identification of the memory unit may comprise an identification of that memory block (e.g. memory block address).

The identification of the memory unit and potentially other associated data may be recorded in a data structure representing a questionable list (i.e. memory units having errors identified in the primary test that are to be subject to further verification) stored in a memory, including for example, local storage (on tester 210). The memory may be a volatile memory or a persistent memory (e.g. database 205 of FIG. 2).

At 330, it is determined whether testing of the memory device is complete; if testing of the memory device is complete, the flow of method 300 proceeds to 335 marking the end of the primary test, otherwise the flow of method 300 proceeds back to 315 where testing of the memory device continues.

In at least one variant embodiment, a threshold value is associated with the primary test. If, for a given memory unit, the number of errors that are detected by the primary test exceeds the threshold value, then an error in the memory unit will be detected. However, if the number of errors that are detected for the given memory unit by the primary test fails to exceed the threshold value, then an error in the memory unit will be deemed to not have been detected, even if some failure of the memory unit had been identified in the primary test. For example, if the threshold value is set to zero, then this effectively would cause an error to be detected for the given memory unit if any error is identified; on the other hand, in some implementations, the threshold value may be set to a higher non-zero value. The threshold value associated with the primary test may be user-configurable (e.g. set by an administrator or test engineer).

The number of errors may be proportionate to the number of test patterns that the memory unit failed during the primary test, for example. In one embodiment, an indication of the number of errors detected in the memory unit by the primary test may be recorded, in association with the identification of the memory unit, in the memory. In another embodiment, a grade for the memory unit (see e.g. discussion of grades with reference to FIG. 1D) may be determined and recorded, in association with the identification of the memory unit, in the memory.

Figure 3B:
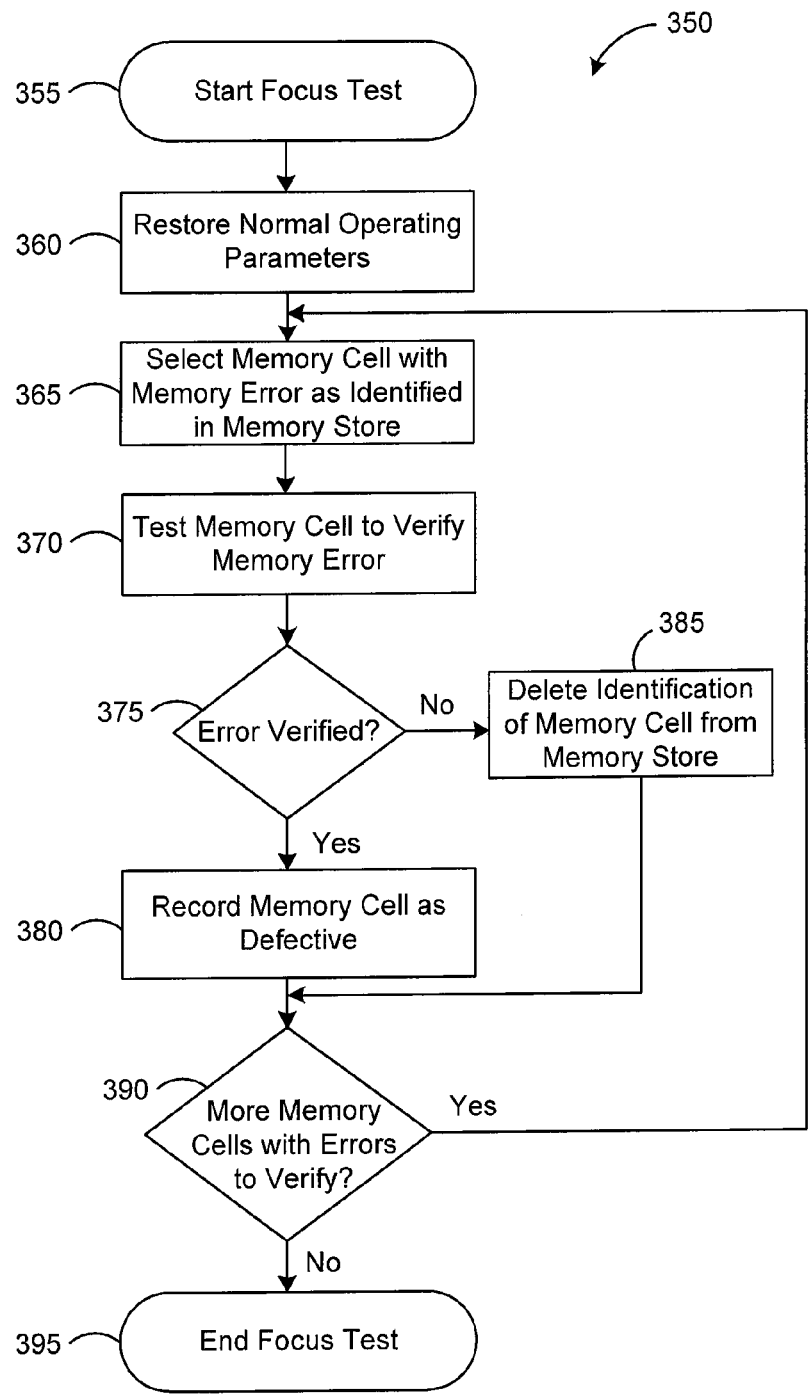
FIG. 3B is a flow diagram illustrating acts of a method of performing a focus test on a memory device in accordance with at least one embodiment.

Referring now to FIG. 3B, a flow diagram illustrating acts of a method of performing a focus test on a memory device in accordance with at least one embodiment is shown generally as 350.

Memory cell failures having patterns of regular and irregular reappearances may be treated differently since repetitive memory cell failures will typically guarantee a computing system crash, while "weaker" non-repetitive memory cell failures typically do not have such severe consequences (i.e., the non-repetitive failures may or may not cause a computing system to crash).

A verification test may be performed subsequent to the primary test (e.g. FIG. 3A) on a memory device to confirm whether errors for particular memory units as identified in the primary test are likely to recur. If an error was detected in the primary test but is not identified as an error in the verification test, then it is likely that the initially-detected error is of a transient nature or potentially the result of faulty test equipment, or that the initially-detected error is due to the primary test having been conducted "over-the-spec" but is unlikely to recur under normal operating conditions, as examples, and therefore the error may not be successfully verified.

This verification test may also be referred to as a focus test herein, and in at least one embodiment, may be performed in a factory testing environment.

In at least one example embodiment, with respect to a given memory unit (e.g. a memory cell or a memory block) for which an error was detected by the primary test, the focus test entails performing a more comprehensive test of the memory unit under normal operating parameters. The "over-the-spec" test is performed initially as a primary test to find weak cells quickly, but since the memory will actually be used under normal conditions, the focus test is performed under normal conditions.

Furthermore, in at least one example embodiment, the focus test comprises performing a memory test not only on a given memory unit, but also on one or more memory cells in the physical neighborhood of that memory unit (e.g. adjacent or otherwise in close proximity to the given memory unit). The one or more cells in the neighborhood of that memory unit may belong to different memory units. This practice recognizes that the operation of weak cells may be affected by physically neighboring cells, and in addition, that weak cells are often found in clusters. The error in the given memory unit may be considered to be successfully verified by the focus test when a number of errors that are detected, by the focus test, in the given memory unit exceed a threshold value associated with the focus test. For example, if the threshold value is set to zero, then this effectively would cause the error in the given memory unit to be successfully verified whenever any error in the given memory unit is identified by the focus test; on the other hand, in some implementations, the threshold value may be set to a higher non-zero value. The threshold value associated with the focus test may be user-configurable (e.g. set by an administrator or test engineer).

In at least one example embodiment, the focus test may involve, in addition to or alternatively to testing of memory cells within the neighborhood of memory units under test, applying a substantially greater number of tests to the memory units under test, compared to the number of tests applied during the primary test. For example, a first number of test patterns may be applied to memory units during the primary test, and a second number of test patterns may be applied to memory units during the focus test, where the second number is substantially greater than the first number. By way of illustration, a memory cell may be subject to testing using a number of test vector patterns on the order of thousands during a primary test, whereas each memory cell being tested during a focus test may be subject to testing using a number of test vector patterns on the order of millions.

The acts of method 350 begin at 355. At 360, the operating parameters that may have been tightened for the primary test are restored, such that the focus test is performed under operating conditions within the specification requirements for the memory device.

At 365, data identifying memory units that failed the primary test is read from memory. For example, a data structure representing a questionable list (e.g. with data for memory units having errors identified in the primary test that are to be subject to further verification) stored in a persistent memory (e.g. database 205 of FIG. 2) may be accessed at 365. A first memory unit is then initially selected for testing. A memory unit may be a memory cell, as illustrated in FIG. 3B by way of example, or some other unit such as a memory block.

At 370, the comprehensive memory test on the selected memory unit is performed (e.g. with the help of tester 210 and handler 215 of FIG. 2). This may involve testing not only the selected memory unit, but also one or more cells in the neighborhood of the selected memory unit as noted above. Testing may involve the use of test vector patterns as generally described with reference to FIG. 2. In some embodiments, functional testing and application-specification testing may be performed at 370.

If, at 375, it is determined that a memory error in the selected memory unit is not successfully verified by the testing performed at 370, then at 385, the selected memory unit is deleted from the questionable list and the flow of method 350 proceeds to 390. On the other hand, if the memory error in the selected memory unit is successfully verified, the selected memory unit is identified as defective in 380.

At 380, identifying the selected memory unit as defective may comprise recording an identification of the memory unit and potentially other associated data in a data structure representing a permanent list (e.g. a list for memory units having errors that have been verified) stored in a memory, which may be a persistent memory (e.g. database 205 of FIG. 2). In one embodiment, an indication of a number of errors (which may be proportionate to the number of test patterns that the memory unit failed during the focus test) may be recorded, in association with the identification of the memory unit, in the memory. In another embodiment, a grade for the memory unit (see e.g. discussion of grades with reference to FIG. 1D) may be determined and recorded, in association with the identification of the memory unit, in the memory.

If the questionable list and the permanent list are implemented using different data structures, the recording of an identification of the memory unit in the permanent list may trigger or be triggered by a contemporaneous deletion of the identification of the memory unit in the questionable list (e.g. an act analogous to act 385 would also be performed before or after 380, although not explicitly shown in FIG. 3B).

However, in a variant implementation, a single data structure may be used to represent both questionable and permanent lists. An identification for each memory unit for which the primary test (FIG. 3A) has detected an error may be stored in the data structure, and a pointer, counter, or other reference may be employed to track which memory units identified in the data structure have completed the verification test (FIG. 3B). The identification of memory units for which an error is not successfully verified may be deleted from the data structure, while the identification of memory units for which the error has been verified may be retained in the data structure.

At 390, it is determined whether the questionable list identifies any more memory units to be verified; if so, the flow of method 350 proceeds back to 365 where a further memory unit is selected for testing, otherwise the flow of method 350 proceeds to 395 marking the end of the focus test.

The inventors have recognized that methods 300 and 350, when performed in combination, constitute a two-part test that greatly improves efficiency with respect to the testing of memory devices in a factory testing environment. The two-part testing methodology may generally be referred to as intelligent memory testing.

A similar two-part testing methodology may also be employed in a field testing environment, after a memory device has already been deployed and is in use within a computing system. A primary test may be performed to initially identify potentially defective memory units, and a verification test ("focus test") may be subsequently performed to verify errors in memory units identified in the primary test.

Figure 4:
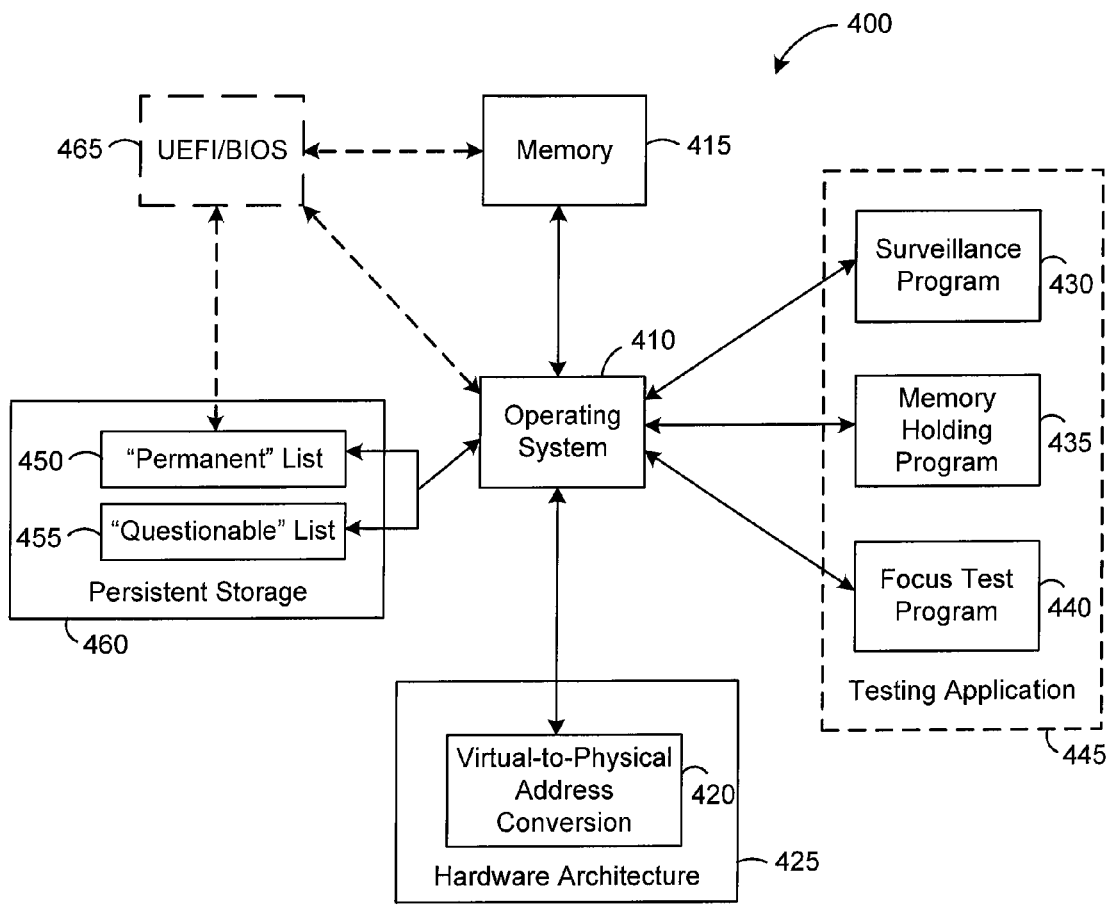
FIG. 4 is a block diagram of a memory testing system, in accordance with at least one embodiment.

Referring now to FIG. 4, a block diagram of a memory testing system in accordance with at least one embodiment is shown generally as 400. In one embodiment, a computing system in which a memory device is being utilized is adapted as test system 400 to test the memory device.

Test system 400 is configured to test a memory device within a memory 415 of the computing system, with the assistance of operating system 410. A surveillance program 430 provides instructions directing one or more processors (not explicitly shown) of the computing system to continuously survey the functioning of memory 415 (somewhat analogous to known anti-virus programs which may operate in the background to provide real-time protection for a computing system).

Since the surveillance program 430 currently operates in what is known as a linear (or virtual) memory address space, if a memory unit (e.g. a memory cell or a memory block) is identified as potentially being defective by the surveillance program 430, a translation of the address of the memory unit in the virtual memory space into the physical memory address space is performed, so that the physical address associated with the memory unit can later be identified. There are special translation tables or look-up tables 420 that may be used to assist in performing a virtual-to-physical address conversion. These tables, in one example implementation, are part of the computer hardware architecture 425. Surveillance program 430 performs the virtual-to-physical address conversions with the assistance of operating system 410 by referring to the look-up tables 420.

Surveillance program 430 may also initiate a memory holding program 435 that isolates failed memory units that were identified in a primary test, and records an identification of the potentially defective memory units and other associated data in a data structure representing a list of questionable errors (e.g. questionable list 455) pending completion of the subsequent verification test to be performed. Questionable list 455 may be stored temporarily in a volatile memory or in a persistent storage device 460 (e.g. in an SPD of a memory module or on a hard drive of the computing system).

While memory units are isolated by memory holding program 435, other software applications that are executing on the computing system are prevented from accessing those memory units, in order to minimize the risks of a crash of the computing system.

The memory units identified as being potentially defective in the primary test in the questionable list 455 are subject to a further test to verify the errors previously found. The verification may be performed at the instruction of a focus test program 440, which will confirm or reject the previously recorded memory errors by performing more extensive testing of the identified memory units, and potentially testing other memory cells in the neighborhood of those identified memory units.

Memory units having verified memory errors can be identified and recorded, potentially along with other associated data, in a list of verified errors (e.g. permanent list 450) within a persistent storage device 460, in accordance with at least one embodiment. As the verification of certain memory units identified in questionable list 455 is completed, the identification of those memory units may be removed from questionable list 455.

In some embodiments, surveillance program 430 and focus test program 440 are active when the computing system is determined to have spare resources (e.g. when at least one processor of the computing system is being underutilized), to avoid significantly slowing down the performance of the computing system.

In some embodiments, some or all of the functionalities of surveillance program 430, memory holding program 435, and focus test program 440 may be integrated into a single testing application 445. Testing application 445 may be installed onto the computing system and/or configured by a user or an administrator, for example.

Test system 400 may also comprise a Unified Extensible Firmware Interface (UEFI) or Basic Input/Output Operating System (BIOS) firmware interface 465 installation, that is configured (among other things) to read data from a permanent list 450 in persistent storage 460 during power-up of the computing system for example, in order to update a system memory map and to provide this information to operating system 410. Operating system 410 can employ the updated memory map such that memory cells that have been found to be defective can be effectively quarantined and thus avoided for use by applications during operation of the computing system.

Figure 5A:
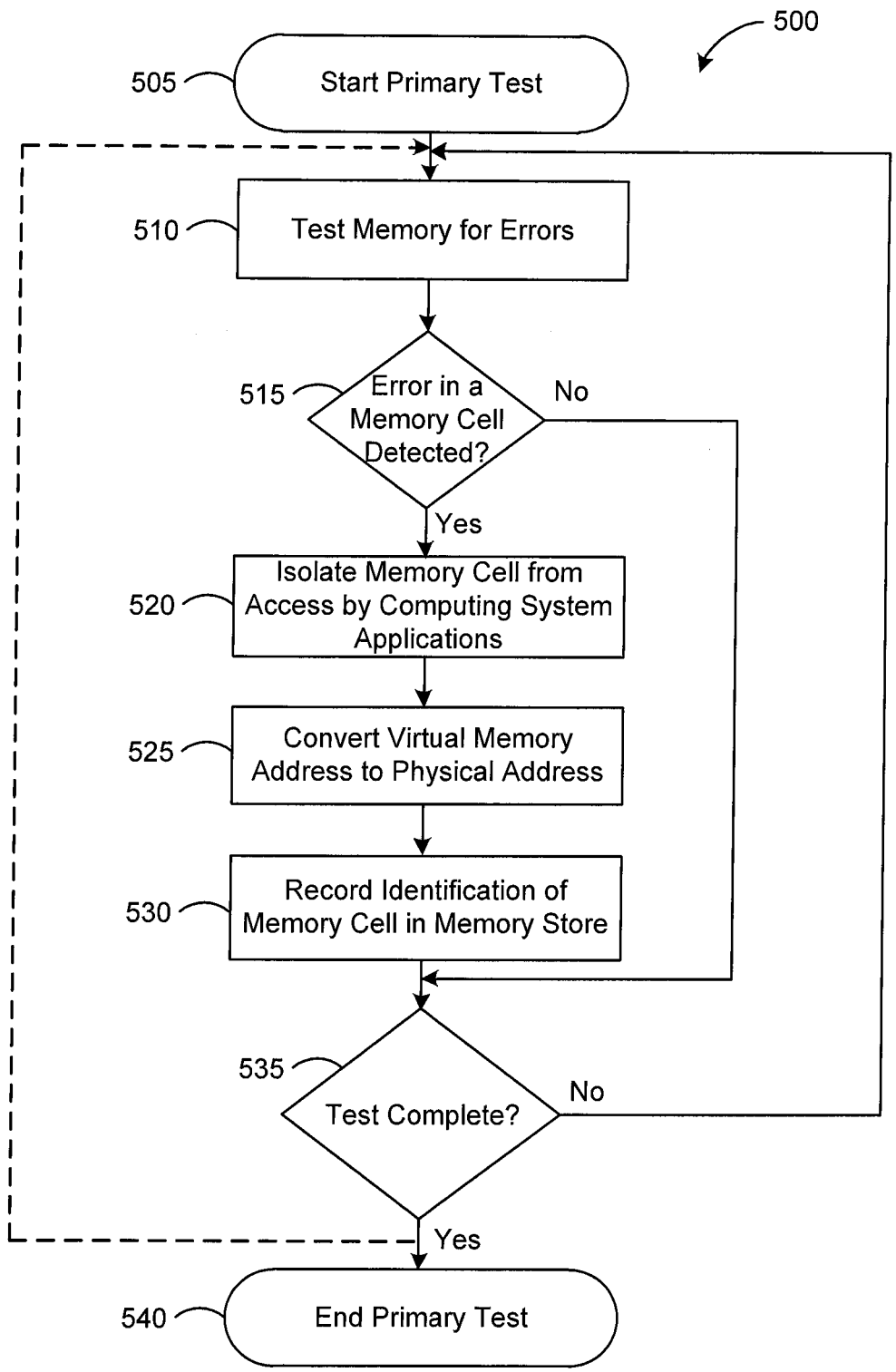
FIG. 5A is a flow diagram illustrating acts of a method of performing a primary test on a memory device in accordance with at least one embodiment.

Referring now to FIG. 5A, a flow diagram illustrating acts of a method of performing a primary test on a memory device in accordance with at least one embodiment is shown generally as 500.

In one example implementation, the method 500 is performed in a field testing environment, which may comprise a computing system adapted as a test system (e.g. test system 400 of FIG. 4) with the aid of software (e.g. testing application 445) installed on the computing system. The testing application configures at least one processor of the computing system to perform acts of method 500.

The primary test performed in method 500, beginning at 505, comprises a surveillance test ("primary test") of usable memory in the computing system, which is first performed in order to detect potentially defective memory cells. The memory being tested may comprise one or more memory devices. This test may be performed in response to a determination that the computing system has spare resources due to a current underutilization of the at least one processor. This may minimize the drain on processing resources of the computing system. For example, the testing application may be configured such that the primary test is performed when the at least one processor is considered to be at 20% utilization (or below). This may mark the primary test as a low priority task. For instance, if the user of the computing device is not doing anything active and the computing device is not running on battery power, then the primary test may be permitted to proceed; if the user recommences using the computing device, the primary test may be halted and the testing application may go into an idle state.

At 510, the memory test on the memory of the computing system is performed (e.g. with the help of surveillance program 430 of FIG. 4). If at least one memory error is detected in a memory unit of the memory at 515, then at 530, in response to detection of the at least one memory error, an identification of the memory unit is recorded in a memory store. Otherwise, the flow of method 500 will proceed directly to 535.

With respect to act 530, the identification of the memory unit is recorded in the memory store pending the completion of a further verification test (see e.g. FIG. 5B) that is performed to verify the detected memory errors. The memory unit may be a single memory cell of a memory device, and the identification of the memory unit may comprise an identification of that memory cell (e.g. cell address), as shown by way of example in FIG. 5A. However, in some embodiments, the memory unit may comprise a memory block consisting of a plurality of memory cells in the memory device, and the identification of the memory unit may comprise an identification of that memory block (e.g. memory block address).

Persons skilled in the art will understand the differences between logical and physical addressable memory spaces.

Logically, a memory space is divided into memory blocks, which are addressable from lower to higher logical memory addresses. While a logically addressable memory space typically spans from lower to higher memory addresses, this is not necessarily true for the corresponding physical memory space. For each memory block, its logical memory address corresponds to the physical address where it can be found in the physical memory space. In order to translate from a logical address to the physical one, a computing system customarily employs a translation table when performing memory management.

In one embodiment, to facilitate recording of the identification of the memory unit in the memory store, at 525, a physical address associated with the memory unit may be determined by converting a virtual memory address of the memory unit to a physical address (e.g. with the help of virtual-to-physical address translation tables or conversion look-up tables 420, typically located inside the microprocessor and being part of the computer hardware architecture 425 of FIG. 4), prior to storing the identification of the memory unit in the memory store. The identification may then comprise the physical address for the memory unit.

Furthermore, in addition to recording the identification of the memory unit (for which an error was detected) in the memory store, in accordance with at least one embodiment, the memory unit is isolated from at least one other application executing on the computing device at 520 (e.g. with the help of memory holding program 435 of FIG. 4). This act entails preventing the at least one application (typically other than the testing application itself) from access the potentially defective memory unit, to minimize the risks of a crash of the computing system until the error with the memory unit can be verified in a further verification test (see e.g. FIG. 5B). Act 520 is shown as being performed prior to recording act 530; however, in variant embodiments, act 520 may be performed in parallel, after, or otherwise contemporaneously with act 530.

In one embodiment, with respect to act 530, the identification of the memory unit and potentially other associated data may be recorded in a data structure representing a questionable list (i.e. a list for memory units having errors identified in the primary test that are to be subject to further verification, such as e.g. questionable list 455 of FIG. 4) stored in a memory, which may be a volatile memory store or a persistent memory (e.g. persistent storage 460 of FIG. 4, which may be an SPD of a memory module, a memory store on a motherboard of the computing device, or on a hard disk, as examples).

At 535, it is determined whether testing of the memory is complete; if testing of the memory is complete (e.g. a user has terminated execution of the testing application or the computing system is restarted), the flow of method 500 proceeds to 540 marking the end of the primary test, otherwise the flow of method 500 proceeds back to 510 where testing of the memory continues.

In one embodiment, surveillance of the memory may be performed continuously—effectively in an endless loop until execution of the testing application terminates or the computing system is restarted. In that case, the flow of method 500 may proceed from act 535 automatically back to 510.

In at least one variant embodiment, a threshold value is associated with the primary test. If, for a given memory unit, the number of errors that are detected by the primary test exceeds the threshold value, then an error in the memory unit will be detected. However, if the number of errors that are detected for the given memory unit by the primary test fails to exceed the threshold value, then an error in the memory unit will be deemed to not have been detected, even if some failure of the memory unit had been identified in the primary test. For example, if the threshold value is set to zero, then this effectively would cause an error to be detected for the given memory unit if any error is identified; on the other hand, in some implementations, the threshold value may be set to a higher non-zero value. The threshold value associated with the primary test may be user-configurable (e.g. set by a user of the computing device or an administrator).

The number of errors may be proportionate to the number of test patterns that the memory unit failed during the primary test, for example. In one embodiment, an indication of the number of errors detected in the memory unit by the primary test may be recorded, in association with the identification of the memory unit, in the memory store. In another embodiment, a grade for the memory unit (see e.g. discussion of grades with reference to FIG. 1D) may be determined and recorded, in association with the identification of the memory unit, in the memory.

Figure 5B:
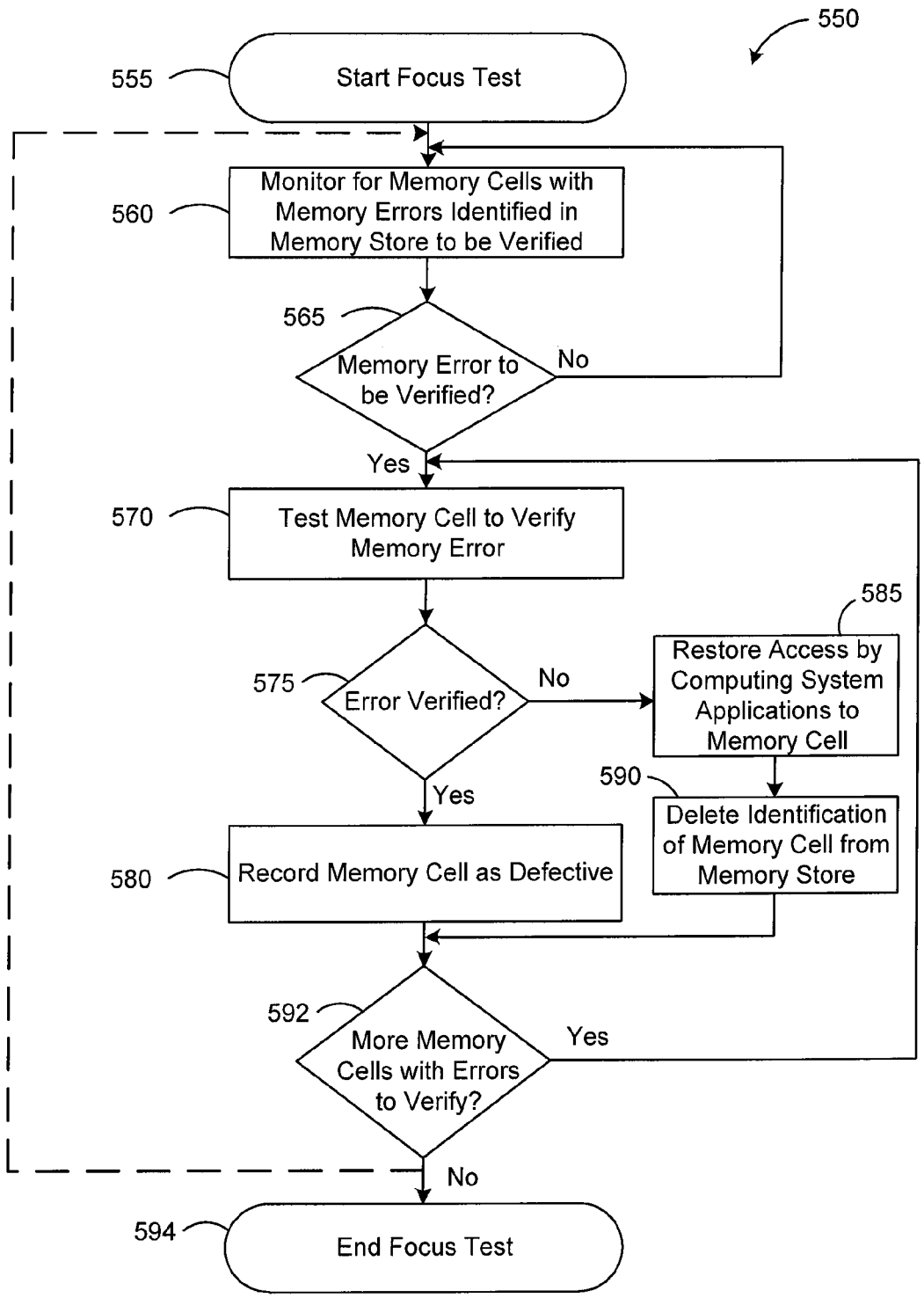
FIG. 5B is a flow diagram illustrating acts of a method of performing a focus test on a memory device in accordance with at least one embodiment.

Referring now to FIG. 5B, a flow diagram illustrating acts of a method of performing a focus test on a memory device in accordance with at least one embodiment is shown generally as 550.

Memory cell failures having patterns of regular and irregular reappearances may be treated differently since repetitive memory cell failures will typically guarantee a computing system crash, while "weaker" non-repetitive memory cell failures typically do not have such severe consequences (i.e., the non-repetitive failures may or may not cause a computing system crash).

A verification test may be performed subsequent to the primary test (e.g. FIG. 5A) on a memory device in a memory of the computing system to confirm whether errors identified in the primary test are likely to recur. If an error was detected in the primary test but is not identified as an error in the subsequent verification test, then it is likely that the initially-detected error is of a transient nature, for example, and therefore the error would not be successfully verified. This verification test may also be referred to as a focus test, and may be performed in the field testing environment (e.g. in a computing system).

In at least one example embodiment, the focus test comprises performing a memory test not only on a given memory unit (whether it be an individual memory cell or a memory block), but also on one or more memory cells in the physical neighborhood of that memory unit (e.g. adjacent or otherwise in close proximity to the given memory unit). The one or more cells in the neighborhood of that memory unit may belong to different memory units. This practice recognizes that the operation of weak cells may be affected by physically neighboring cells, and in addition, that weak cells are often found in clusters. The error in the given memory unit may be considered to be successfully verified by the focus test when a number of errors that are detected, by the focus test, in the given memory unit exceed a threshold value associated with the focus test. For example, if the threshold value is set to zero, then this effectively would cause the error in the given memory unit to be successfully verified whenever any error in the given memory unit is identified by the focus test; on the other hand, in some implementations, the threshold value may be set to a higher non-zero value. The threshold value associated with the focus test may be user-configurable (e.g. set by a user of the computing system or an administrator).

In at least one example embodiment, the focus test may involve, in addition to or alternatively to testing of memory cells within the neighborhood of memory units under test, applying a substantially greater number of tests to the memory units under test, compared to the number of tests applied during the primary test. For example, a first number of test patterns may be applied to memory units during the primary test, and a second number of test patterns may be applied to memory units during the focus test, where the second number is substantially greater than the first number. By way of illustration, a memory cell may be subject to testing using a number of test vector patterns on the order of thousands during a primary test, whereas each memory cell being tested during a focus test may be subject to testing using a number of test vector patterns on the order of millions.

The main purpose of the primary test is to scan the whole range of memory of a computing system to check that it is in working order. This test may be done when computer is idle. For example, if the computing system is idle for one hour, the number of test patterns employed may be smaller than when the computing system has been idle for an entire day. On the other hand, the main purpose of the focus test is to test questionable memory cells in depth. These cells are tested with an extensive set of test vector patterns until they are found either to be good, or their problems are identified.

In one implementation, the focus test may be performed in response to a determination that the computing system has spare resources due to a current underutilization of the at least one processor. This may minimize the drain on processing resources of the computing system. For example, the testing application may be configured such that the focus test is performed when the at least one processor is considered to be at 20% utilization (or below). This may mark the focus test as a low priority task. For instance, if the user of the computing device is not doing anything active and the computing device is not running on battery power, then the focus test may be permitted to proceed; if the user recommences using the computing device, the focus test may be halted and the testing application may go into an idle state.

The acts of method 550 begin at 555. At 560, data identifying memory units that failed the primary test is read from memory. For example, a data structure in which memory units with memory errors have been identified (e.g. in questionable list 455 of FIG. 4) and which are pending verification are monitored and accessed.

If the questionable list is empty, or if it is otherwise determined that there are no memory units with errors to be verified at 565, the flow of method 550 will proceed back to 560 to continue monitoring. In one embodiment, the frequency at which the questionable list is polled may be user-defined (e.g. by a user of the computing device or an administrator). Otherwise, if a memory unit is identified for which an error is to be verified, a first memory unit is then initially selected for testing, and the flow of method 550 proceeds to 570. A memory unit may be a memory cell, as illustrated in FIG. 5B by way of example, or some other unit such as a memory block.

At 570, the comprehensive memory test on the selected memory unit is performed (e.g. with the help of focus test program 440 of FIG. 4). This may involve testing not only the selected memory unit, but also one or more cells in the neighborhood of the selected memory unit as noted above.

If, at 575, it is determined that a memory error in the selected memory unit is not successfully verified by the testing performed at 570, then at 590, the selected memory unit is deleted from the questionable list and the flow of method 550 proceeds to 592. On the other hand, if the memory error in the selected memory unit is successfully verified, the selected memory unit is identified as defective in 580.

If the selected memory unit is identified as defective in 580, the testing application may continue to prevent access to the memory unit by another application of the computing system.

In one embodiment, at 585, if the memory error in the selected memory unit was not successfully verified, the isolated memory unit (see e.g. 520 of FIG. 5A) is released back for use by the operating system (e.g. operating system 410 of FIG. 4) of the computing system, thus restoring access by other applications of the computing system to the memory unit. In a variant embodiment, a threshold value may be associated with this restoring act, which can be configured to be different from any threshold value that may be associated with the focus test. For example, access by other applications of the computing system to the memory unit is restored when the number of errors that are detected by the focus test in the memory unit falls below the threshold value associated with the restoring act. This may allow for the possibility that a certain number of errors may be verified for a memory unit that would be sufficient to render the memory unit defective, but would not exceed a threshold that suggests the memory unit should remain in isolation.

At 580, identifying the selected memory unit as defective may comprise recording an identification of the memory unit and potentially other associated data in a data structure representing a permanent list (i.e. a list for memory units having errors that have been verified, such as e.g. permanent list 450 of FIG. 4) stored in a memory, which may be a persistent memory (e.g. persistent storage 460 of FIG. 4, which may be an SPD of a memory module, a memory store on a motherboard of the computing device, or a hard disk, as examples). In one embodiment, an indication of a number of errors (which may be proportionate to the number of test patterns that the memory unit failed during the focus test) may be recorded in association with the identification of the memory unit in the persistent memory. In another embodiment, a grade for the memory unit (see e.g. discussion of grades with reference to FIG. 1D) may be determined and recorded, in association with the identification of the memory unit, in the memory.

If the questionable list and the permanent list are implemented using different data structures, the recording of a memory unit as defective in the permanent list may trigger or be triggered by a contemporaneous deletion of the identification of the memory unit in the questionable list (e.g. an act analogous to act 590 would also be performed before or after 580, although not explicitly shown in FIG. 5B).

However, in a variant implementation, a single data structure may be used to represent both questionable and permanent lists. An identification for each memory unit for which the primary test (FIG. 5A) has detected an error may be stored in the data structure, and a pointer, counter, or other reference may be employed to track which memory units identified in the data structure have completed the verification test (FIG. 5B). The identification of memory units for which an error is not successfully verified may be deleted from the data structure, while the identification of memory units for which the error has been verified may be retained in the data structure.

At 592, it is determined whether there are more memory units identified in the questionable list to be verified; if so, the flow of method 550 proceeds back to 570 where a next memory unit is selected for testing, otherwise the flow of method 550 proceeds to 594 marking the end of the focus test.

In one embodiment, the acts of method 550 may be performed continuously—effectively in an endless loop until execution of the testing application terminates or the computing system is restarted. In that case, the flow of method 550 may proceed from act 592 automatically back to 560.

The inventors have recognized that methods 500 and 550, when performed in combination, constitute a two-part test that greatly improves efficiency with respect to the testing of memory devices in a field testing environment.

Memory units for which errors have been verified in a focus test (e.g. method 550 of FIG. 5B, or method 350 of FIG. 3B) can be removed from a usable memory space (e.g. 150 of FIG. 1B) of a memory of a computing system. This may be done, for example, during the power up or a restart of a computing system.

Figure 6:
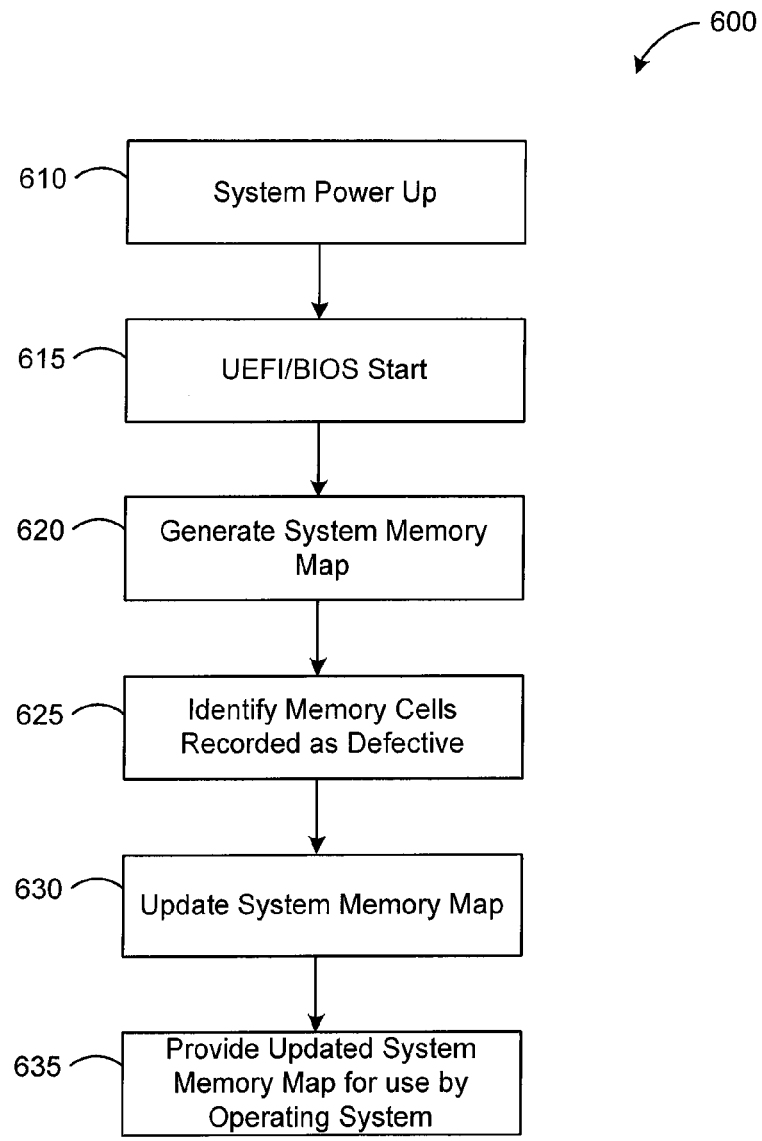
FIG. 6 is a flow diagram illustrating acts of a method of managing memory errors on a memory device in accordance with at least one embodiment.

Referring now to FIG. 6, a flow diagram illustrating acts of a method of managing memory errors on a memory device in accordance with at least one embodiment is shown generally as 600.

At 610, the computing system is powered up. Then, at 615, the UEFI/BIOS hardware (e.g. 465 of FIG. 4) of the computing system starts and performs its functions in a known manner.

At 620, a system memory map is generated. This version of the map has yet to be adjusted to accommodate defective memory units (e.g. memory cells and/or memory blocks) that have been identified and verified during testing in accordance with at least one of the embodiments described herein.

Accordingly, in one example embodiment, at 625, a data structure identifying defective memory units (e.g. permanent list 450 of FIG. 4) is accessed, and the data therein is used to update the system memory map at 630. When this updated system memory map is provided to the operating system at 635, the defective memory units may be deleted from the usable memory space, and the risks of a computing crash will be minimized.

Moreover, in at least one embodiment, memory units that have been excluded from an updated system memory map will also be excluded from further testing (e.g. from the memory units being tested at 510 of FIG. 5A and/or verified at 570 of FIG. 5B), thereby conserving processing resources on the computing system.

Acts of one or more of the methods described herein may be embodied as computer-readable instructions, stored in a non-volatile storage device, for example.

Additional embodiments include any one of the embodiments described above, where one or more of its components, functionalities or structures is interchanged with, replaced by or augmented by one or more of the components, functionalities or structures of a different embodiment described above.

It should be understood that various changes and modifications to the embodiments described herein will be apparent to those skilled in the art. Such changes and modifications can be made without departing from the spirit and scope of the present disclosure and without diminishing its intended advantages. It is therefore intended that such changes and modifications be covered by the appended claims.

Although several embodiments of the disclosure have been disclosed in the foregoing specification, it is understood by those skilled in the art that many modifications and other embodiments of the disclosure will come to mind to which the disclosure pertains, having the benefit of the teaching presented in the foregoing description and associated drawings. It is thus understood that the disclosure is not limited to the specific embodiments disclosed herein above, and that many modifications and other embodiments are intended to be included within the scope of the appended claims. Moreover, although specific terms are employed herein, as well as in the claims which follow, they are used only in a generic and descriptive sense, and not for the purposes of limiting the present disclosure, nor the claims which follow.

The following is claimed:

1. A method of testing a memory device within a computing system, wherein a plurality of applications are executable by at least one processor of the computing system, the method comprising:
    performing a first memory test on the memory device;
    detecting, from the first memory test, at least one error in a memory unit of the memory device;
    in response to the detecting, performing acts to verify the at least one error comprising:
        preventing at least one of the plurality of applications from accessing the memory unit;
        performing a second memory test on the memory unit;
        determining, from the second memory test, whether the at least one error is successfully verified; and
        if the at least one error is successfully verified, identifying the memory unit as defective.

2. The method of claim 1, wherein the identifying comprises recording an identification of the memory unit in a persistent memory.

3. The method of claim 2, further comprising:
    if the at least one error is successfully verified, recording, in association with the identification of the memory unit in the persistent memory, an indication of a number of errors detected in the memory unit.

4. The method of claim 1, wherein the memory unit comprises one of:
    a single memory cell of the memory device; or
    a memory block consisting of a plurality of memory cells of the memory device.

5. The method of claim 1, wherein performing the first memory test comprises applying a first number of test patterns, and wherein performing the second memory test on the memory unit comprises applying a second number of test patterns, the second number being substantially greater than the first number.

6. The method of claim 1, further comprising:
    performing the second memory test on one or more memory cells neighboring the memory unit;
        wherein the at least one error is successfully verified when a number of errors that are detected by the second memory test in the memory unit exceeds a threshold value associated with the second memory test.

7. The method of claim 1, further comprising:
    restoring access by the at least one of the plurality of applications to the memory unit in response to determining that the at least one error is not successfully verified.

8. The method of claim 7, further comprising:
    continuing to prevent the at least one of the plurality of applications from accessing the memory unit in response to determining that the at least one error is successfully verified.

9. The method of claim 1, further comprising:
    generating an updated system memory map that excludes the memory unit if the memory unit is identified as defective.

10. The method of claim 1, wherein a threshold value is associated with the first memory test, and wherein the acts to verify the at least one error are performed in response to determining that a number of errors that are detected by the first memory test in the memory unit exceeds the threshold value associated with the first memory test.

11. The method of claim 10, wherein the threshold value associated with the first memory test comprises one of:
zero; or
a value greater than zero.

12. The method of claim 10, wherein the threshold value associated with the first memory test is user-configurable.

13. The method of claim 1, wherein the acts to verify the at least one error further comprise:
recording an identification of the memory unit in a memory pending completion of the second memory test.

14. The method of claim 13, further comprising:
determining a physical address associated with the memory unit, wherein the identification of the memory unit comprises the physical address.

15. The method of claim 13, further comprising:
recording, in association with the identification of the memory unit in the memory, an indication of a number of errors detected in the memory unit.

16. The method of claim 13, further comprising:
deleting the identification of the memory unit from the memory upon completion of the second memory test.

17. The method of claim 1, wherein the at least one error is successfully verified when a number of errors that are detected by the second memory test in the memory unit exceeds a threshold value associated with the second memory test.

18. The method of claim 17, further comprising:
restoring access by the at least one of the plurality of applications to the memory unit if the number of errors that are detected by the second memory test in the memory unit falls below a threshold value associated with the restoring.

19. The method of claim 17, wherein the threshold value associated with the second memory test comprises one of:
zero; or
a value greater than zero.

20. The method of claim 17, wherein the threshold value associated with the second memory test is user-configurable.

21. The method of claim 1, wherein the method is performed by a testing application, and wherein the preventing comprises isolating the memory unit from access by any one of the plurality of applications, other than the testing application.

22. The method of claim 1, wherein the method is performed in response to determining that the computing system has spare resources due to an underutilization of the at least one processor.

23. A computing system configured to allow testing of a memory device within the computing system, the system comprising:
at least one processor, wherein a plurality of applications are executable by the at least one processor; and
a memory;
wherein the plurality of applications comprises a testing application, comprising instructions that when executed by the at least one processor, configured the at least one processor to:
perform a first memory test on the memory device;
detect, from the first memory test, at least one error in a memory unit of the memory device;
in response to detecting the at least one error, perform acts to verify the at least one error comprising:
preventing at least one the plurality of applications from accessing the memory unit;
performing a second memory test on the memory unit;
determining, from the second memory test, whether the at least one error is successfully verified; and
if the at least one error is successfully verified, identifying the memory unit as defective.

24. A computer-readable medium comprising instructions for testing a memory device within a computing system, wherein the instructions, when executed by at least one processor of the computing system, configure the at least one processor to:
perform a first memory test on the memory device;
detect, from the first memory test, at least one error in a memory unit of the memory device;
in response to detecting the at least one error, perform acts to verify the at least one error comprising:
preventing at least one the plurality of applications from accessing the memory unit;
performing a second memory test on the memory unit;
determining, from the second memory test, whether the at least one error is successfully verified; and
if the at least one error is successfully verified, identifying the memory unit as defective.

25. A method of testing a memory device, the method comprising:
performing a first memory test on the memory device, wherein the first memory test is performed under operating conditions that exceed specification requirements for the memory device;
detecting, from the first memory test, at least one error in a memory unit of the memory device;
in response to the detecting, performing acts to verify the at least one error comprising:
performing a second memory test on the memory unit, wherein the second memory test is performed under operating conditions within the specification requirements for the memory device;
determining, from the second memory test, whether the at least one error is successfully verified; and
if the at least one error is successfully verified, identifying the memory unit as defective.

26. The method of claim 25, wherein the identifying comprises recording an identification of the memory unit in a persistent memory.

27. The method of claim 26, further comprising:
if the at least one error is successfully verified, recording, in association with the identification of the memory unit in the persistent memory, an indication of a number of errors detected in the memory unit.

28. The method of claim 25, wherein the memory unit comprises one of:
a single memory cell of the memory device; or
a memory block consisting of a plurality of memory cells of the memory device.

29. The method of claim 25, wherein performing the first memory test comprises applying a first number of test patterns, and wherein performing the second memory test on the memory unit comprises applying a second number of test patterns, the second number being substantially greater than the first number.

30. The method of claim 25, further comprising:
performing the second memory test on one or more memory cells neighboring the memory unit;
wherein the at least one error is successfully verified when a number of errors that are detected by the second memory test in the memory unit exceeds a threshold value associated with the second memory test.

31. The method of claim 25, wherein a threshold value is associated with the first memory test, and wherein the acts to verify the at least one error are performed in response to determining that a number of errors that are detected by the first memory test in the memory unit exceeds the threshold value associated with the first memory test.

32. The method of claim 31, wherein the threshold value associated with the first memory test comprises one of:
   zero; or
   a value greater than zero.

33. The method of claim 31, wherein the threshold value associated with the first memory test is user-configurable.

34. The method of claim 25, wherein the acts to verify the at least one error further comprise:
   recording an identification of the memory unit in a memory pending completion of the second memory test.

35. The method of claim 34, further comprising:
   recording, in association with the identification of the memory unit in the memory, an indication of a number of errors detected in the memory unit by the first memory test.

36. The method of claim 34, further comprising:
   deleting the identification of the memory unit from the memory upon completion of the second memory test.

37. The method of claim 25, wherein the at least one error is successfully verified when a number of errors that are detected by the second memory test in the memory unit exceeds a threshold value associated with the second memory test.

38. The method of claim 37, wherein the threshold value associated with the second memory test comprises one of:
   zero; or
   a value greater than zero.

39. The method of claim 37, wherein the threshold value associated with the second memory test is user-configurable.

40. The method of claim 25, wherein the method is performed in a factory environment.

41. A testing system configured to test a memory device, the testing system comprising:
   at least one processor; and
   a memory;
   wherein the at least one processor is configured to:
   perform a first memory test on the memory device, wherein the first memory test is performed under operating conditions that exceed specification requirements for the memory device;
   detect, from the first memory test, at least one error in a memory unit of the memory device;
   in response to detecting the at least one error, perform acts to verify the at least one error comprising:
      performing a second memory test on the memory unit, wherein the second memory test is performed under operating conditions within the specification requirements for the memory device;
      determining, from the second memory test, whether the at least one error is successfully verified; and
      if the at least one error is successfully verified, identifying the memory unit as defective.

42. A computer-readable medium comprising instructions for testing a memory device, wherein the instructions, when executed by at least one processor of a testing system, configure the at least one processor to:
   perform a first memory test on the memory device, wherein the first memory test is performed under operating conditions that exceed specification requirements for the memory device;
   detect, from the first memory test, at least one error in a memory unit of the memory device;
   in response to detecting the at least one error, perform acts to verify the at least one error comprising:
      performing a second memory test on the memory unit, wherein the second memory test is performed under operating conditions within the specification requirements for the memory device;
      determining, from the second memory test, whether the at least one error is successfully verified; and
      if the at least one error is successfully verified, identifying the memory unit as defective.

* * * * *